(12) United States Patent
Shimizu

(10) Patent No.: US 7,582,946 B2
(45) Date of Patent: Sep. 1, 2009

(54) SEMICONDUCTOR DEVICE WITH MULTI-TRENCH SEPARATION REGION AND METHOD FOR PRODUCING THE SAME

(75) Inventor: Kazuhiro Shimizu, Tokyo (JP)

(73) Assignee: Mitsubishi Denki Kabuhsiki Kaisha, Tokyo (JP)

( * ) Notice: Subject to any disclaimer, the term of this patent is extended or adjusted under 35 U.S.C. 154(b) by 4 days.

(21) Appl. No.: 11/393,773

(22) Filed: Mar. 31, 2006

(65) Prior Publication Data
US 2007/0013022 A1 Jan. 18, 2007

(30) Foreign Application Priority Data
Jul. 15, 2005 (JP) ............... 2005-206616

(51) Int. Cl.
*H01L 27/02* (2006.01)
(52) U.S. Cl. ............... 257/501; 257/E27.009
(58) Field of Classification Search ............... 257/500, 257/501, 510, 513, 516, 520
See application file for complete search history.

(56) References Cited

U.S. PATENT DOCUMENTS

| | | | |
|---|---|---|---|
| 4,866,495 A * | 9/1989 | Kinzer | 257/337 |
| 6,246,101 B1 | 6/2001 | Akiyama | |
| 6,439,514 B1 * | 8/2002 | Yamaguchi et al. | 257/500 |
| 6,603,176 B2 * | 8/2003 | Akiyama | 257/351 |
| 2004/0232522 A1 | 11/2004 | Shimizu | |
| 2005/0056906 A1 * | 3/2005 | Jimbo et al. | 257/492 |
| 2005/0194656 A1 | 9/2005 | Shimizu | |

FOREIGN PATENT DOCUMENTS

| | | |
|---|---|---|
| DE | 10 2004 022 376 A1 | 12/2004 |
| DE | 10 2004 063 523 A1 | 9/2005 |
| JP | 2004-349296 | 12/2004 |
| JP | 2005-64472 | 3/2005 |

OTHER PUBLICATIONS

Kiyoto Watabe, et al., "A 0.8μm High Voltage IC using Newly Designed 600V Lateral IGBT on Thick Buried-Oxide SOI", Proc. ISPSD, 1996, pp. 151-154.

\* cited by examiner

*Primary Examiner*—Minh-Loan T Tran
*Assistant Examiner*—W. Wendy Kuo
(74) *Attorney, Agent, or Firm*—Oblon, Spivak, McClelland, Maier & Neustadt, P.C.

(57) ABSTRACT

A semiconductor device is configured that a high-withstand voltage semiconductor device (101) and logic circuits (201 and 301) are integrated on a single chip and that a high-withstand voltage high-potential island (402) including the high-potential-side logic circuit (301) is separated using multiple partition walls enclosing therearound. The semiconductor device is provided with a multi-trench separation region (405) having a level shift wire region (404) that is used to connect the high-potential-side logic circuit to the high-potential-side electrode of the high-withstand voltage semiconductor device.

17 Claims, 42 Drawing Sheets

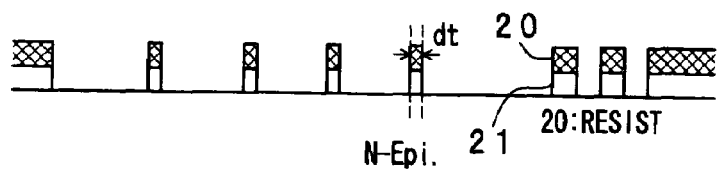
Fig. 12A
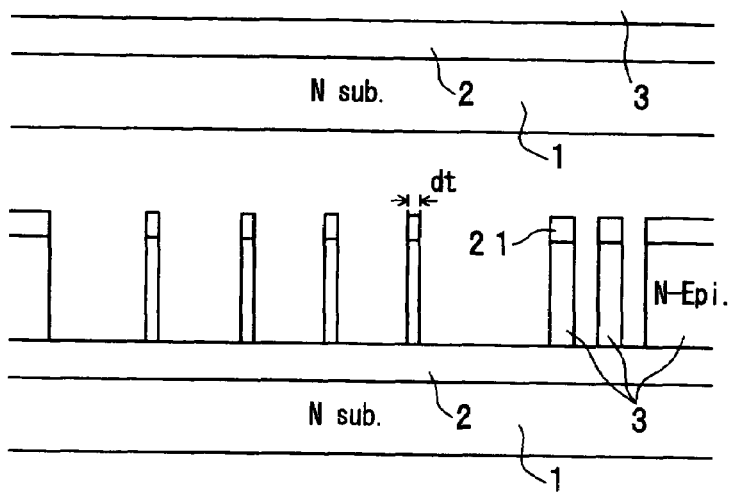
Fig. 12B
Fig. 12C
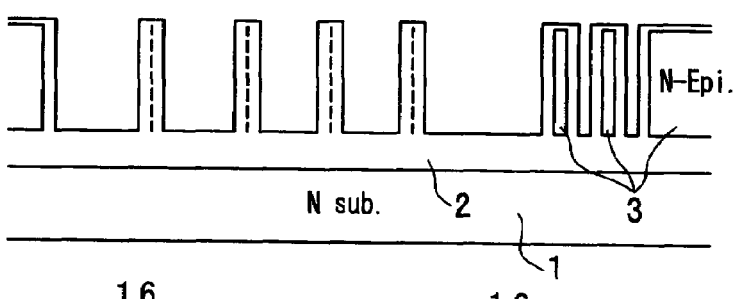
Fig. 12D
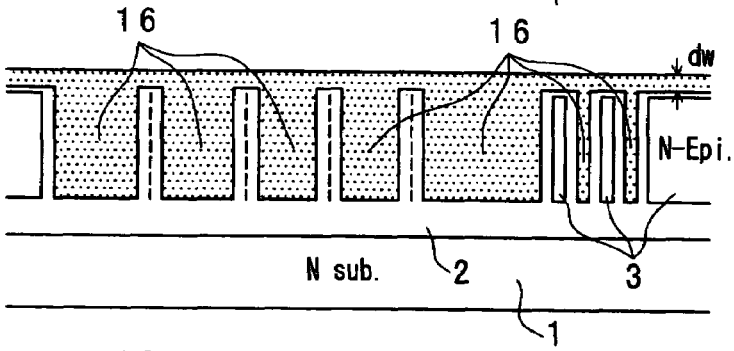
Fig. 12E
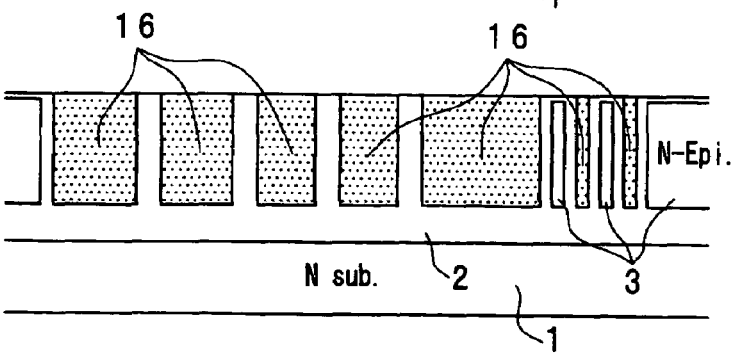

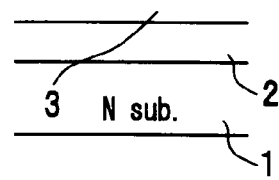
Fig. 14A
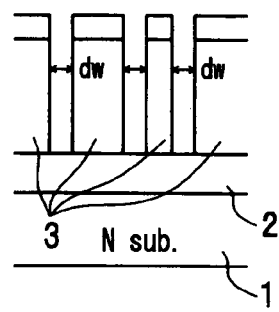
Fig. 14B
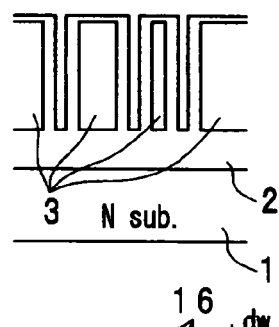
Fig. 14C
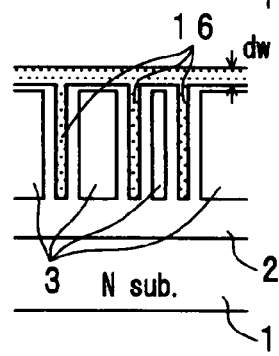
Fig. 14D
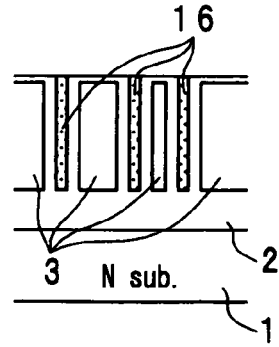
Fig. 14E

SECTION A-A'
(P-CHANNEL MOS)

SECTION B-B'
(N-CHANNEL MOS)

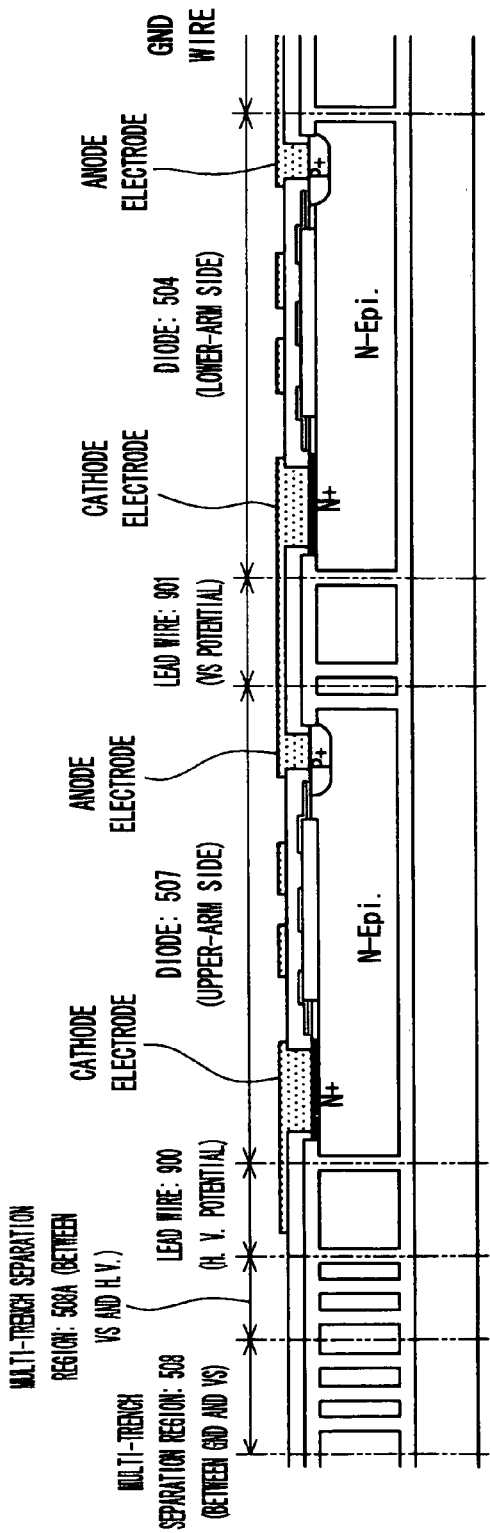
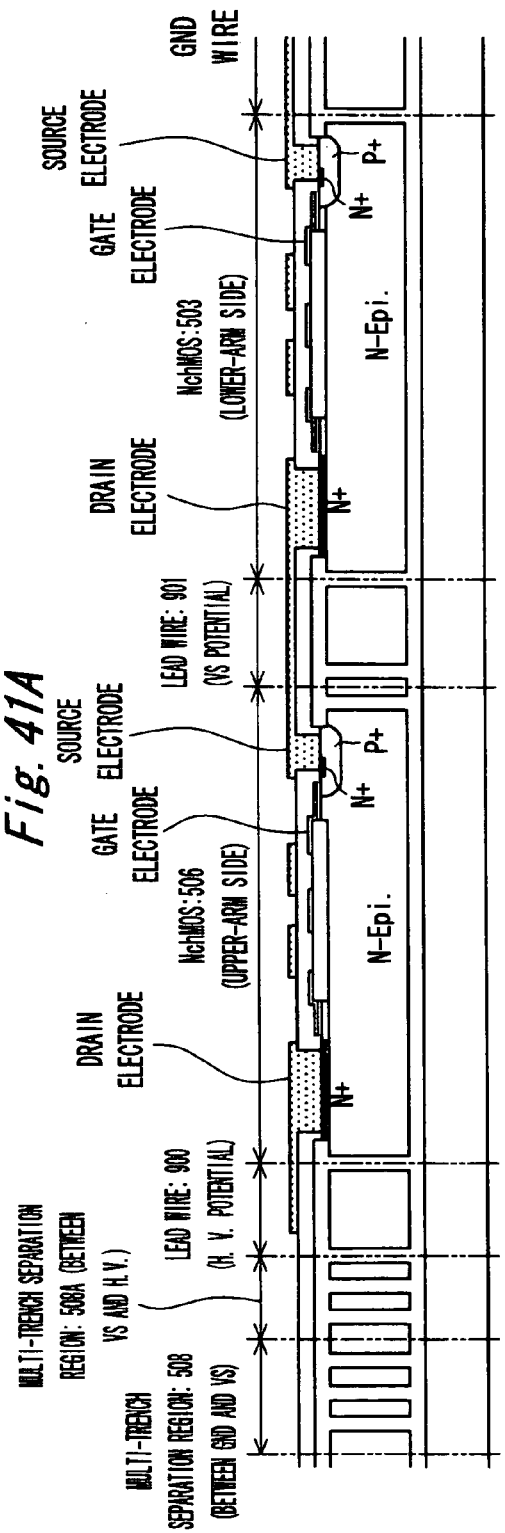
Fig. 41A
Fig. 41B

SEMICONDUCTOR DEVICE WITH MULTI-TRENCH SEPARATION REGION AND METHOD FOR PRODUCING THE SAME

FIELD OF THE INVENTION

The present invention relates to a semiconductor device, more particularly, to a high-withstand voltage semiconductor device and a method for producing the same.

BACKGROUND OF THE INVENTION

As a conventional high-withstand voltage semiconductor device, a power integrated circuit device (HVIC: High Voltage IC) in which a power semiconductor device and logic circuits are integrated on a single chip has been used to control the driving of various apparatuses, such as motors, lighting apparatuses and imaging apparatuses.

FIG. 44 is a plan view showing a conventional power integrated circuit device (hereafter simply referred to as an HVIC). FIGS. 45 to 48 are sectional views of the conventional HVIC shown in FIG. 44. FIG. 45 is a sectional view taken on line A-A' of FIG. 44, FIG. 46 is a sectional view taken on line B-B' of FIG. 44, and FIG. 47 is a sectional view taken on line C-C' of FIG. 44. FIG. 48 is a block diagram showing the configuration of a high-side (high-potential-side) driver circuit of the conventional HVIC.

The HVIC shown in FIG. 44 comprises a high-withstand voltage N-channel MOSFET 100, a first logic circuit 200 connected to the gate electrode of the MOSFET 100 and a high-potential island 400 having a high-potential-side second logic circuit 300 connected to the drain electrode of the MOSFET 100. The high-potential island 400 is separated from other low-potential regions using a trench separation region 401, and the drain electrode of the MOSFET 100 is connected to the second logic circuit 300 using a high-potential level shift wire.

As shown in the sectional views of the HVIC, FIG. 45, FIG. 46 and FIG. 47, a buried oxide film 2 and an N⁻-type epitaxial layer 3 are formed on an N-type semiconductor substrate 1 (a P-type can also be used). As shown in FIG. 45, P⁺-type separation-diffusion regions 4 are formed so as to reach the buried oxide film 2 and enclose trench separation regions 16. In FIG. 45, FIG. 46 and FIG. 47, numeral 5 designates a deep N⁺-type diffusion region, numeral 6 designates a P diffusion region, numeral 7 designates a P⁺-type diffusion region, numeral 8 designates an N⁺-type diffusion region, numeral 9 designates a gate electrode also used as a field plate, numeral 10 designates an aluminum electrode also used as a GND-side field plate, numeral 11 designates an oxide film, numeral 12 designates a level shift aluminum electrode used as the level shift wire, and numeral 14 designates a field oxide film (LOCOS film). The HVIC has a separation structure, that is, a RESURF (Reduced Surface Field) structure, in which the N⁻-type epitaxial layer 3 is separated and enclosed using the trench separation regions 16 and the P⁺-type separation-diffusion regions 4 (for example, refer to U.S. Pat. No. 4,292,642). FIG. 48 shows a multi-trench separation region in the high-side (high-potential-side) driver circuit of the conventional HVIC in broken lines.

As shown in FIGS. 44 and 45, the conventional HVIC is configured that the level shift aluminum electrode 12 serving as a high-potential level shift wire crosses over the P⁺-type separation-diffusion regions 4 having the potential of the substrate and the P diffusion regions 6. Hence, the elongation of a depletion layer that is formed on the N⁻-type epitaxial layer 3 is hindered, whereby there is a problem of lowering the withstand voltage of the device.

This problem in the structure of the conventional HVIC is dealt with using an MFFP (Multiple Floating Field Plate) structure in which a field plate is formed on the PN junction using a gate electrode or the like to obtain the elongation of the depletion layer, field plates are formed multiply by floating, and the surface field is stabilized using capacitance coupling (for example, JP-A No. 5-190693).

However, in the case that the potential difference between the level shift aluminum electrode 12 serving as the high-potential level shift wire and an aluminum electrode 10 serving as the GND-side field plate is larger than the dielectric strength voltage of the oxide film 11 formed between these layers, the structure must be designed so that a region in which the level shift aluminum electrode 12 serving as the high-potential level shift wire and the aluminum electrode 10 serving as the GND-side field plate overlap does not exist. If they overlap, the GND-side field plate (aluminum electrode 10) in such a region must be cut off.

In the conventional semiconductor device, when the voltage required for the HVIC becomes high, there is a problem that equipotential lines are distorted owing to the fact that the GND-side field plate (the aluminum electrode 10) is not provided under the level shift wire and owing to the influence of the potential of the level shift wire, whereby field concentration occurs and the withstand voltage of the device is lowered as described above. Conventionally, for the purpose of relieving this problem, the oxide film 11 between the level shift aluminum electrode 12 and the aluminum electrode 10 is formed to have a thickness of 2.0 µm or more. However, this increase in the thickness of the oxide film 11 between the layers makes the production process complicated and raises the cost of the production. In addition, if the oxide film 11 between the layers is formed to have a large thickness, there is a disadvantage that microfabrication technology cannot be applied. Furthermore, the problem that the equipotential lines are distorted owing to the influence of the high potential of the level shift wire cannot be avoided. Hence, a structure having no level shift wire has been desired.

SUMMARY OF THE INVENTION

The present invention is intended to provide a semiconductor device production method capable of easily producing a highly reliable semiconductor device having a high-withstand voltage configuration by eliminating intersections between low-potential regions and high-potential wires and by using simple production processing, and to provide a highly reliable semiconductor device having excellent performance and produced using the production method.

For the purpose of attaining the above-mentioned object, a semiconductor device in which a power semiconductor device and logic circuits are integrated on a single chip, includes:

a high-withstand voltage semiconductor device having an oxide film and an epitaxial layer on a support substrate, a high-potential-side logic circuit connected to the high-potential-side electrode of the high-withstand voltage semiconductor device, a low-potential-side logic circuit that outputs control signals for controlling the driving of the high-withstand voltage semiconductor device, and a multi-trench separation region that separates a high-potential island including the high-potential-side logic circuit, that is formed of multiply overlaid trench separation regions and that has a level shift wire region for connecting the high-potential-side logic circuit to the high-potential-side electrode of the high-withstand voltage semiconductor device. In the semiconductor device according to the present invention configured as described above, there is no intersection between the low-potential regions and the high-potential wires, whereby the reliability of the high-withstand voltage power semiconductor device is raised.

Furthermore, in a method for producing a semiconductor device in which a power semiconductor device and logic circuits are integrated on a single chip, the semiconductor device includes:

a high-withstand voltage semiconductor device having an oxide film and an epitaxial layer on a support substrate a high-potential-side logic circuit connected to the high-potential-side electrode of the high-withstand voltage semiconductor device, a low-potential-side logic circuit that outputs control signals for controlling the driving of the high-withstand voltage semiconductor device, and a multi-trench separation region that separates a high-potential island including the high-potential-side logic circuit, that is formed of multiply overlaid trench separation regions and that has a level shift wire region for connecting the high-potential-side logic circuit to the high-potential-side electrode of the high-withstand voltage semiconductor device, the level shift wire region is formed by carrying out:

a step of forming trenches in the epitaxial layer by carrying-out anisotropic etching, a step of burying a dielectric material in the trenches, a step of etching the dielectric material while leaving the dielectric material inside the trenches, oxidizing the surface, accumulating a nitride film, and carrying out patterning, a step of eliminating the nitride film and accumulating an interlayer oxide film, and a step of partially etching the interlayer oxide film and forming electrodes by carrying out metal accumulation. In the method comprising these steps for producing the semiconductor device according to the present invention, there is no intersection between the low-potential regions and the high-potential wires, whereby a high-withstand voltage configuration is formed easily using simple production steps.

With the present invention, a highly reliable semiconductor device having a high-withstand voltage configuration and being excellent in withstand voltage performance can be produced using a simple production method. Furthermore, a semiconductor device having no intersection between the low-potential regions and the high-potential wires and being excellent in withstand voltage performance can be provided.

BRIEF DESCRIPTION OF THE DRAWINGS

The present invention will become more fully understood from the detailed description and the accompanying drawings, wherein:

FIGS. 12A to 12E are views showing process flows for producing the trench side wall field plate structure of the semiconductor device according to Embodiment 1;

FIGS. 14A to 14E are views showing process flows for producing the trench side wall field plate structure of the semiconductor device according to Embodiment 1;

FIG. 41A is a sectional view taken on line A-A' of FIG. 39, and FIG. 41B is a sectional view taken on line B-B' of FIG. 39;

DETAILED DESCRIPTION OF THE PREFERRED EMBODIMENTS

Preferred embodiments of a semiconductor device and a method for producing the semiconductor device according to the present invention will be described below referring to the accompanying drawings. In the following embodiments, components having the substantially same functions and configurations are designated by the same numerals and explained.

Embodiment 1

Figure 1:
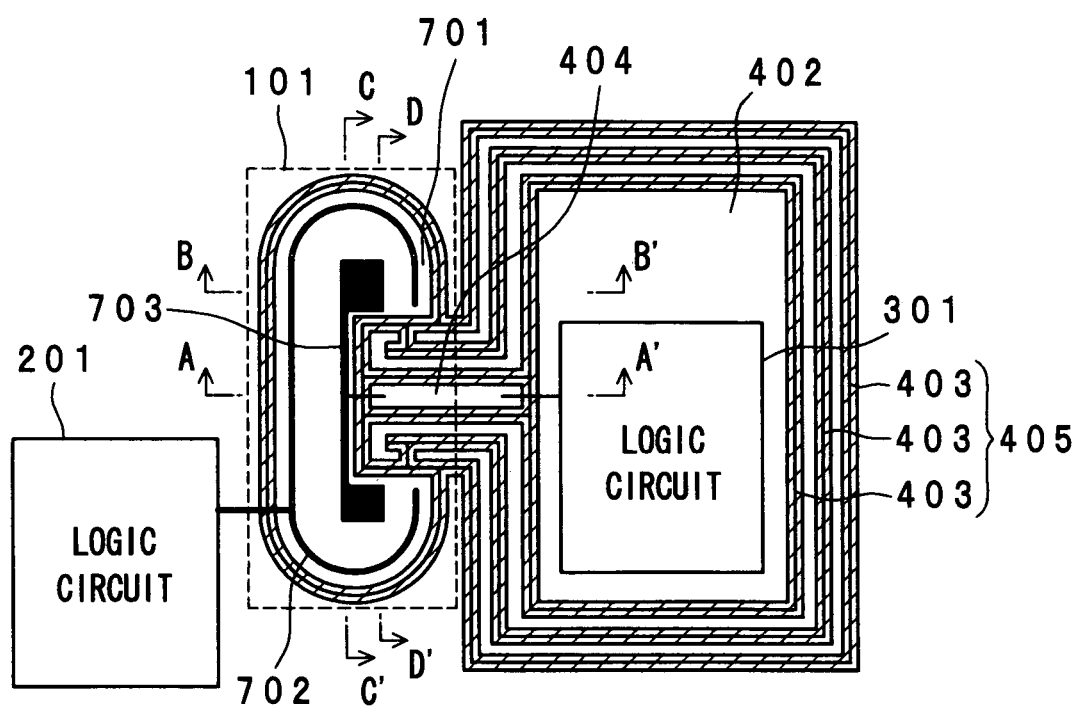
FIG. 1 is a plan view showing a power integrated circuit device (HVIC) serving as an example of a semiconductor device according to Embodiment 1 of the present invention.
Figure 2:
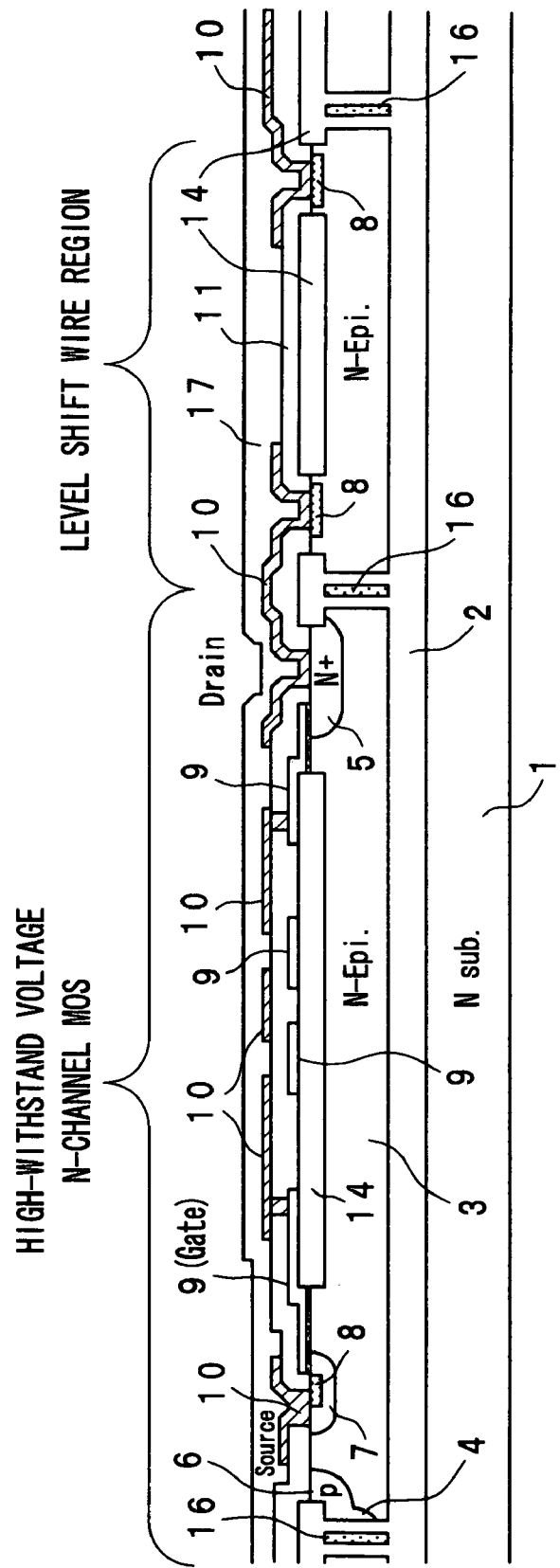
FIG. 2 is a sectional view of the semiconductor device, taken on line A-A' of FIG. 1.
Figure 3:
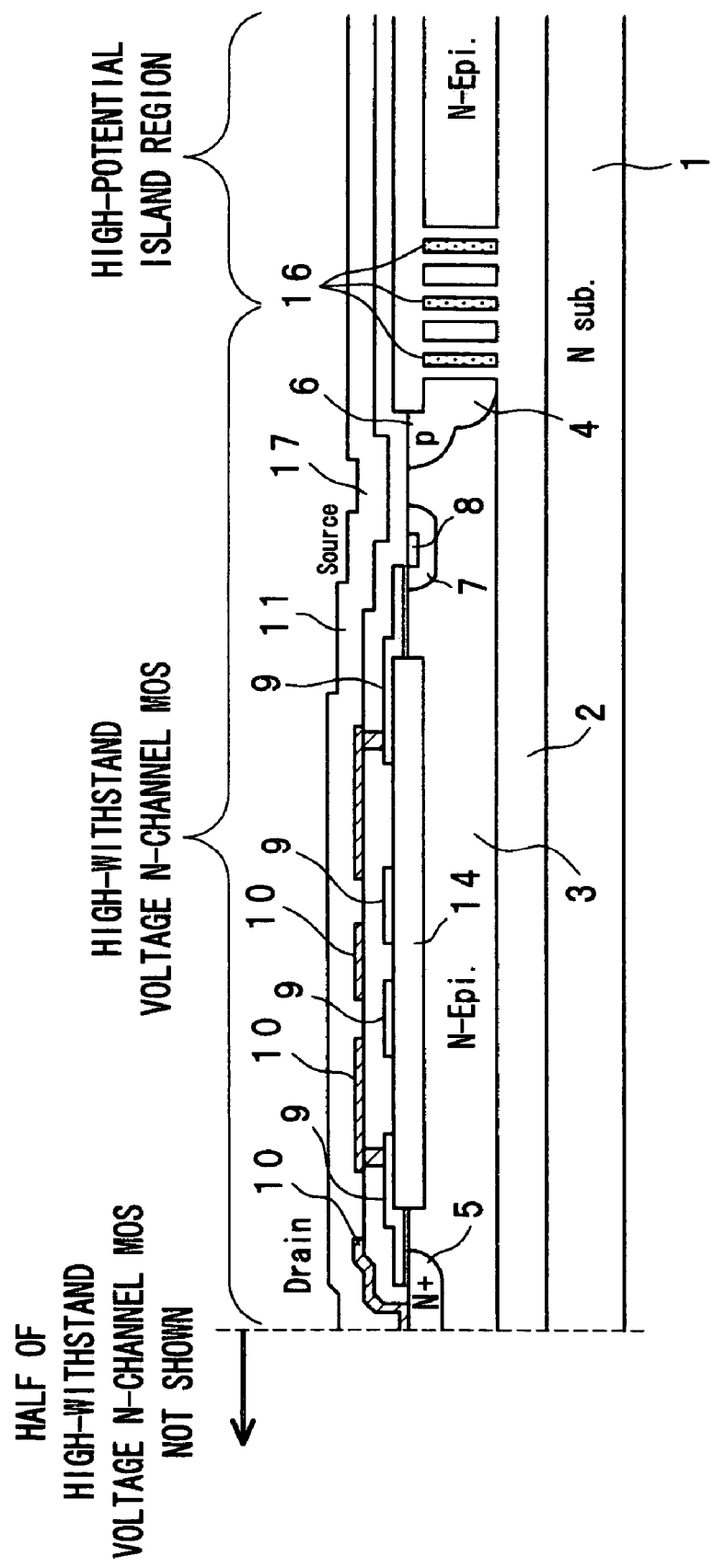
FIG. 3 is a sectional view of the semiconductor device, taken on line B-B' of FIG. 1.
Figure 4:
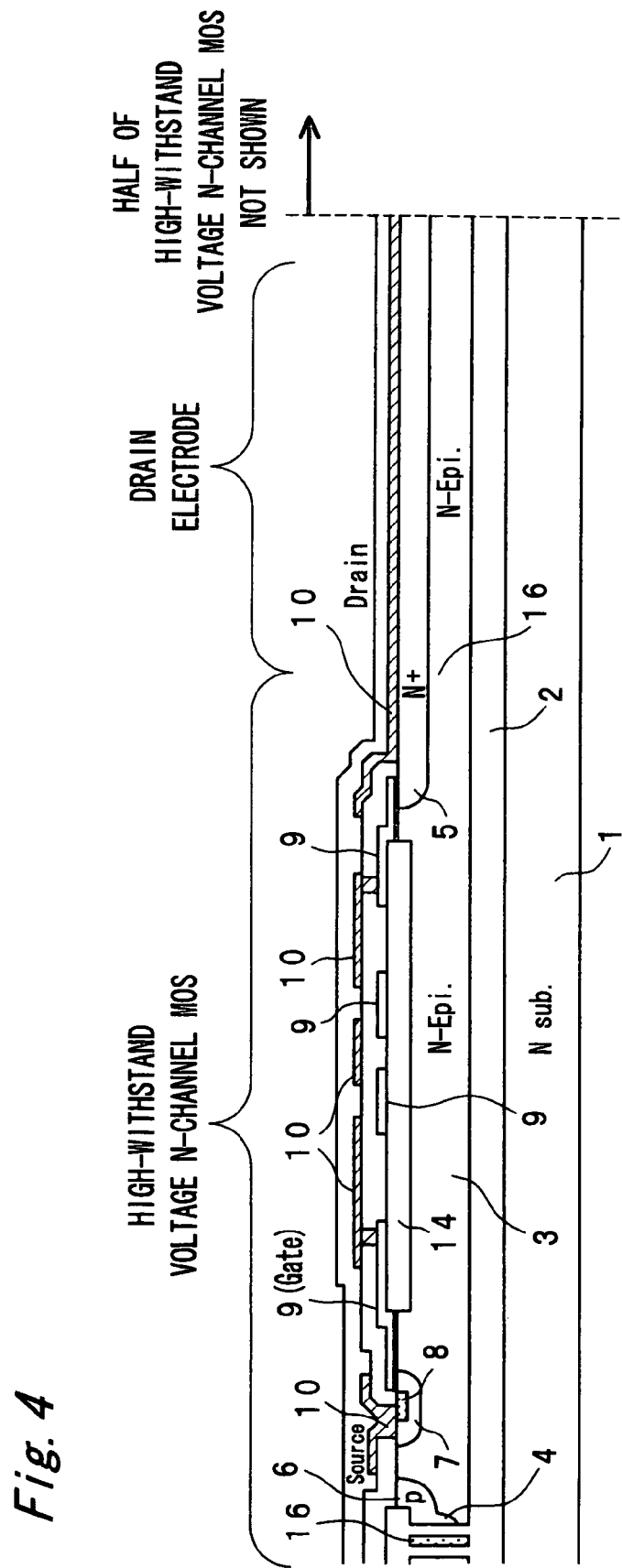
FIG. 4 is a sectional view of the semiconductor device, taken on line C-C' of FIG. 1.
Figure 5:
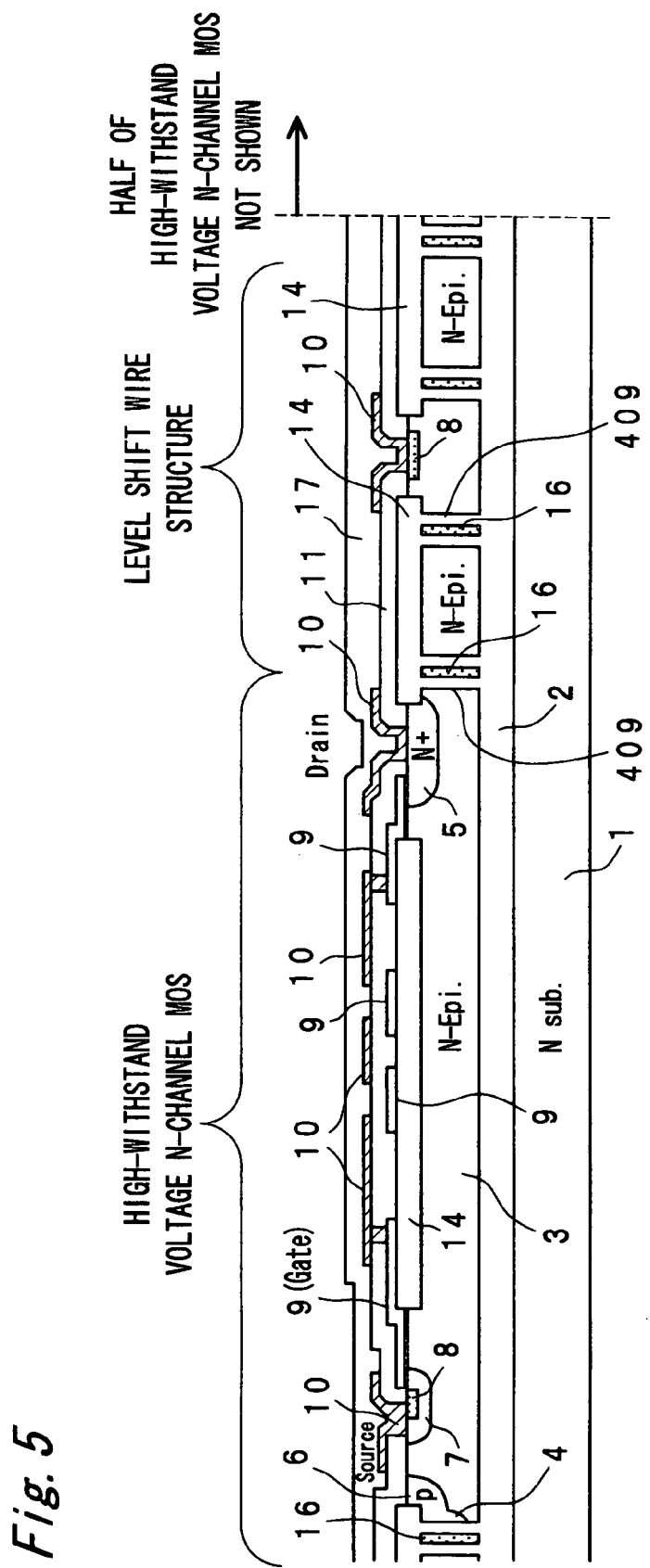
FIG. 5 is a sectional view of the semiconductor device, taken on line D-D' of FIG. 1.

FIG. 1 is a plan view showing a power integrated circuit device (hereafter simply referred to as an HVIC) serving as an example of a semiconductor device according to Embodiment 1 of the present invention. In FIG. 1, this HVIC is schematically shown to facilitate the explanation of the HVIC according to Embodiment 1, and the sizes of its components and the spaces between them are different from those of an actual device. FIGS. 2 to 5 are sectional views of the HVIC shown in FIG. 1. FIG. 2 is a sectional view taken on line A-A' of FIG. 1, FIG. 3 is a sectional view taken on line B-B' of FIG. 1, FIG. 4 is a sectional view taken on line C-C' of FIG. 1, and FIG. 5 is a sectional view taken on line D-D' of FIG. 1.

As shown in FIG. 1, the HVIC according to Embodiment 1 comprises a high-withstand voltage N-channel MOSFET 101, a low-potential-side logic circuit 201 that is connected to the gate electrode 702 of the MOSFET 101 and outputs control signals for controlling the driving of the MOSFET 101, and a high-withstand voltage high-potential island 402 having a high-potential-side logic circuit 301 connected to the drain electrode 703 of the MOSFET 101. The high-potential island 402 including the high-potential-side logic circuit 301 is enclosed and separated using trench separation regions 403 formed so as to be overlaid in multiple layers. A multi-trench separation region 405 includes the trench separation regions 403 formed so as to be overlaid in multiple layers as described above.

In FIGS. 2 to 5, numeral 1 designates an N-type semiconductor substrate 1 (a P-type can also be used), numeral 2 designates a buried oxide film, and numeral 3 designates an $N^-$-type epitaxial layer. A $P^+$-type separation-diffusion region 4 is formed so as to reach the buried oxide film 2. In the sectional views of FIGS. 2 to 5, numeral 5 designates a deep $N^+$-type diffusion region, numeral 6 designates a P diffusion region, numeral 7 designates a $P^+$-type diffusion region, and numeral 8 designates an $N^+$-type diffusion region. Numeral 9 designates a gate electrode, and the gate electrode is also used as a field plate. An aluminum electrode 10 is used as a GND-side field plate.

In the HVIC according to Embodiment 1, numeral 11 designates an oxide film, numeral 14 designates a field oxide film (LOCOS film), numeral 16 designates a trench separation region, and numeral 17 designates a passivation film. In the HVIC according to Embodiment 1, the $N^-$-type epitaxial layer 3 has a RESURF (Reduced Surface Field) structure in which the $N^-$-type epitaxial layer 3 is enclosed using the $P^+$-type separation-diffusion region 4 and the trench separation region 16.

Figure 45:
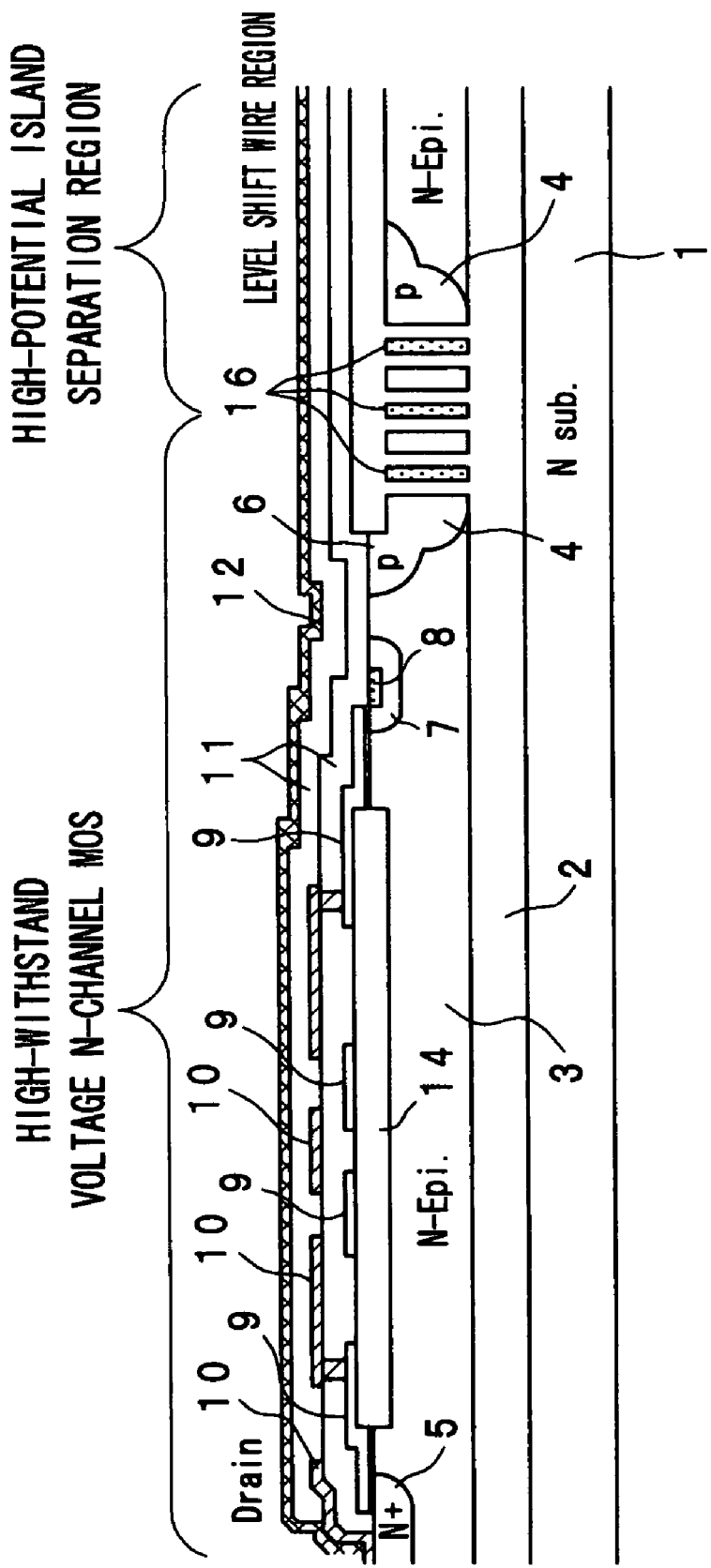
FIG. 45 is the sectional view of the power integrated circuit device, taken on line A-A' of FIG. 44.
Figure 46:
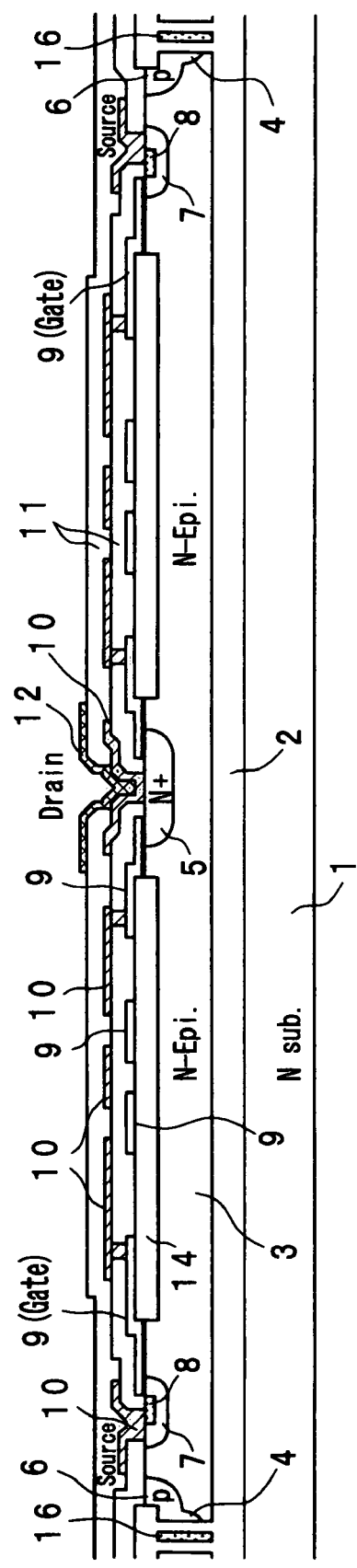
FIG. 46 is the sectional view of the power integrated circuit device, taken on line B-B' of FIG. 44.
Figure 47:
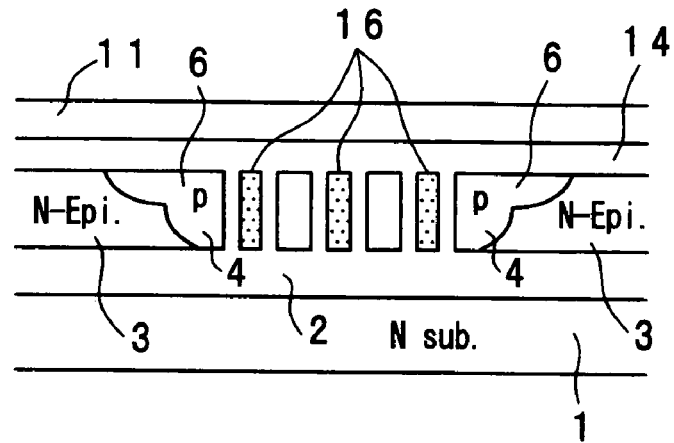
FIG. 47 is the sectional view of the power integrated circuit device, taken on line C-C' of FIG. 44.
Figure 48:
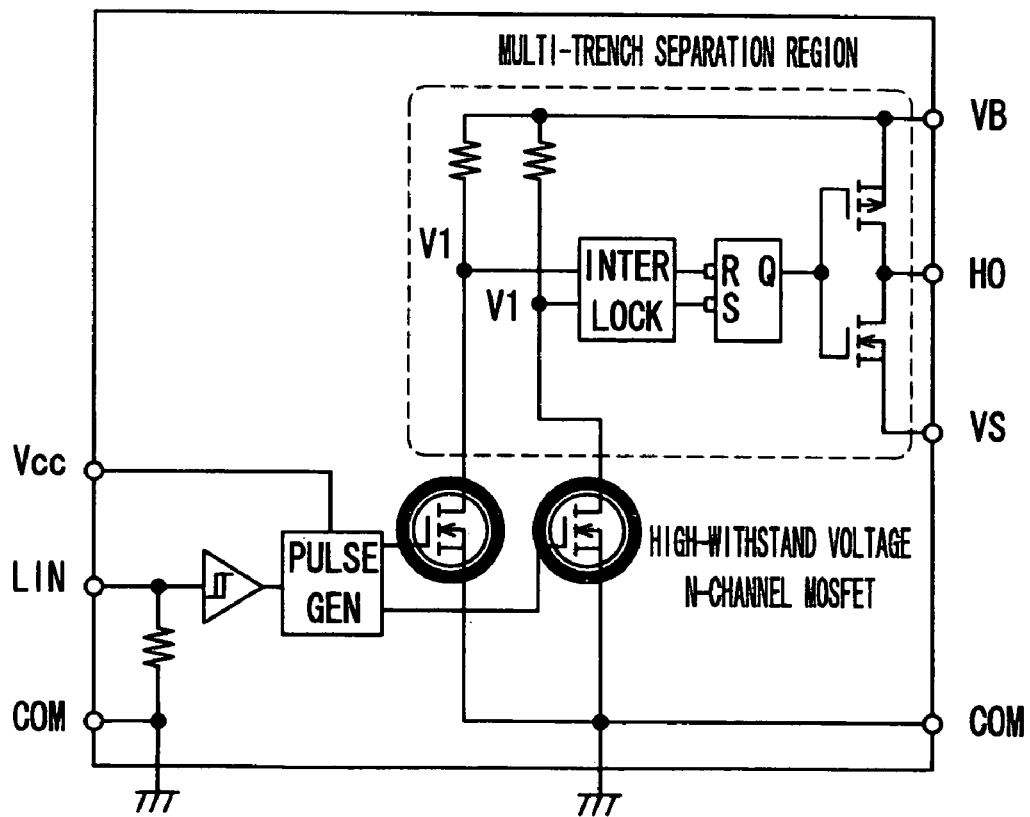
FIG. 48 is the block diagram showing the configuration of the high-side (high-potential-side) driver circuit of the conventional power integrated circuit device.

In the aforementioned conventional HVIC, the "level shift wire" that connects the drain electrode of the high-withstand voltage N-channel MOSFET for level shift operation to the logic circuit inside the high-potential island is formed of the level shift aluminum electrode 12 (see FIG. 45). The level shift aluminum electrode 12 crosses between the drain and the source of the N-channel MOSFET, passes through the trench separation regions and is introduced into the high-potential island.

The HVIC according to Embodiment 1 is configured that part of the multi-trench separation region 405 is used as a level shift wire region 404, instead of the level shift wire structure of the conventional HVIC in which the level shift aluminum electrode 12 is used, and that the power semiconductor device is electrically connected to the high-voltage-side logic circuit. Furthermore, the HVIC according to Embodiment 1 is configured that the level shift wire region 404 is biased using the capacitance coupling of the $N^-$-type epitaxial region and the polysilicon region inside the trench separation region.

As shown in FIG. 1, the multi-trench separation region 405 of the HVIC according to Embodiment 1 is used to separate the high-potential island 402, and the level shift wire region 404 is provided between the source and the drain of the high-withstand voltage N-channel MOSFET 101. In the level shift wire region 404, the outermost trench separation region 403 and its N⁻-type epitaxial region in the multi-trench separation region 405 are disposed in the source region on the low potential (GND) side. In addition, in the level shift wire region 404, the trench separation region 403 having the highest potential and disposed so as to make contact with the high-potential island 402 is extended and disposed so as to make contact with the drain. The N⁻-type-epitaxial region is formed so as to be enclosed using the trench separation region :403- having the high potential, and the region is used as the level shift wire. Because the N⁻-type epitaxial region enclosed using the trench separation region 403 having the- high potential is used as the level shift wire as described above, a structure in which low-potential regions, such as the source region, do not intersect with the level shift wire is attained.

Figure 6:
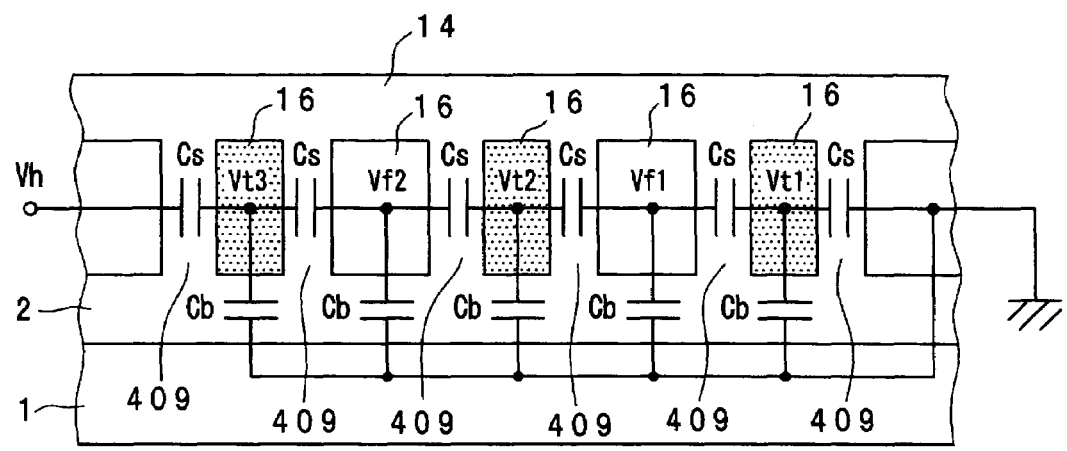
FIG. 6 shows an equivalent circuit of the capacitance coupling in the multi-trench separation region of the semiconductor device according to Embodiment 1.
Figure 7:
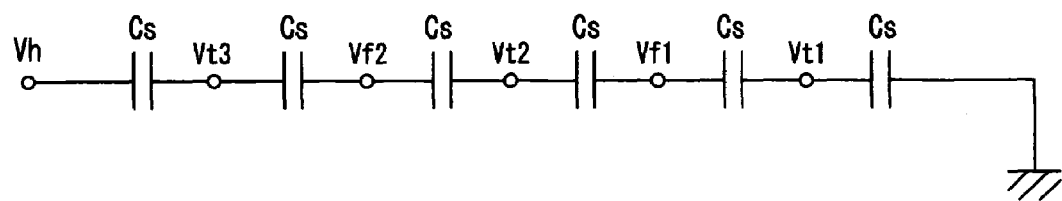
FIG. 7 is a simplified view of the equivalent circuit shown in FIG. 6.

FIG. 6 shows an equivalent circuit of the capacitance coupling in the multi-trench separation region 405. In FIG. 6, the capacitance of the trench inside wall oxide film 409 of the multi-trench separation region 405 is designated by Cs, and the capacitance formed of the buried oxide film 2 at the bottom of the trench and the N-type semiconductor substrate 1 is designated by Cb. In addition, Vt1, Vt2, . . . designate the potentials of the polysilicon regions inside the trenches, and Vf1, Vf2, . . . designate the potentials of the N⁻-type epitaxial layers disposed between the trench separation regions and being in a floating potential state. The ratio between the depth d and the width w of the trench, that is, the aspect ratio d/w, is usually 10 or more. The thickness of the field oxide film 14 of the trench inside wall oxide film 409 is approximately 0.3 µm, and the thickness of the buried oxide film 2 is approximately 3 µm or more. This means that the latter is approximately 10 times as large as the former. The capacitance C is calculated according to the following equation; $C = \epsilon S/t$. However, when the capacitance value Cb at the bottom of the trench is compared with the capacitance value Cs of the trench inside wall oxide film 409, the area S of the former is 1/10 of the latter, and the thickness t of the oxide film of the former is 10 times as large as the latter. Hence, the capacitance value Cb is 1/100 or less of the capacitance value Cs and has a negligibly small value. With this taken into consideration, the equivalent circuit shown in FIG. 6 can be simplified as shown in FIG. 7. When it is assumed that each of the capacitances of the trench inside wall oxide films 409 formed multiply is nearly equal to Cs, the potentials of the N⁻-type epitaxial layers and the polysilicon regions inside the trenches are evenly shared and biased.

Figure 8:
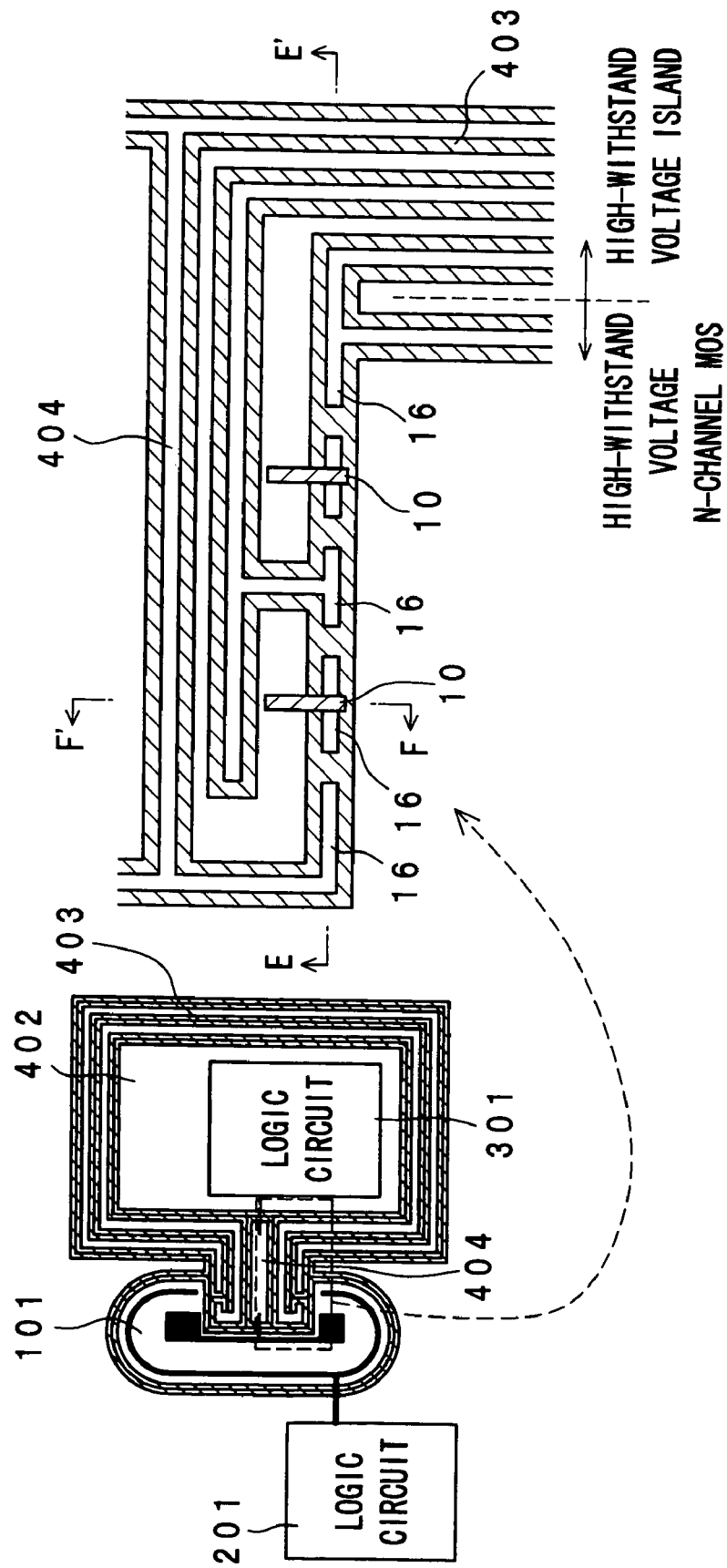
FIG. 8A is a plan view showing the configuration of the semiconductor device according to Embodiment 1.
FIG. 8B is a magnified view showing part of the multi-trench separation region of the semiconductor device according to Embodiment 1.

FIGS. 8A and 8B show the structure of a trench side wall field plate of the high-potential island 402, which is formed using the potential of the multi-trench separation region 405, a characteristic of the HVIC according to Embodiment 1. FIG. 8A shows the configuration of the HVIC according to Embodiment 1. FIG. 8B is a magnified view showing a part of the multi-trench separation region of the HVIC according to Embodiment 1, the part being enclosed with broken line in the HVIC of FIG. 8A.

Figure 9:
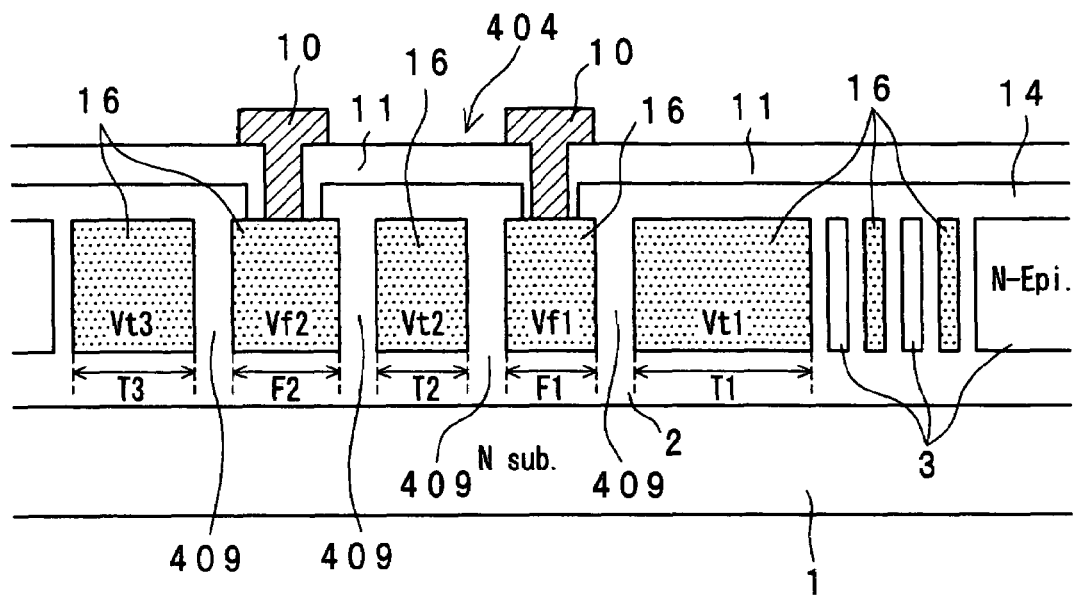
FIG. 9 is a sectional view showing the structure of the trench side wall field plate of the semiconductor device according to Embodiment 1.
Figure 10:
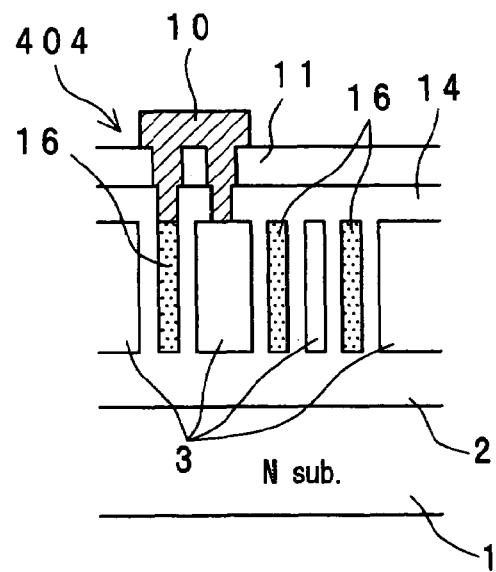
FIG. 10 is a sectional view of a level shift wire region, taken on line F-F' of FIG. 8B
Figure 11:
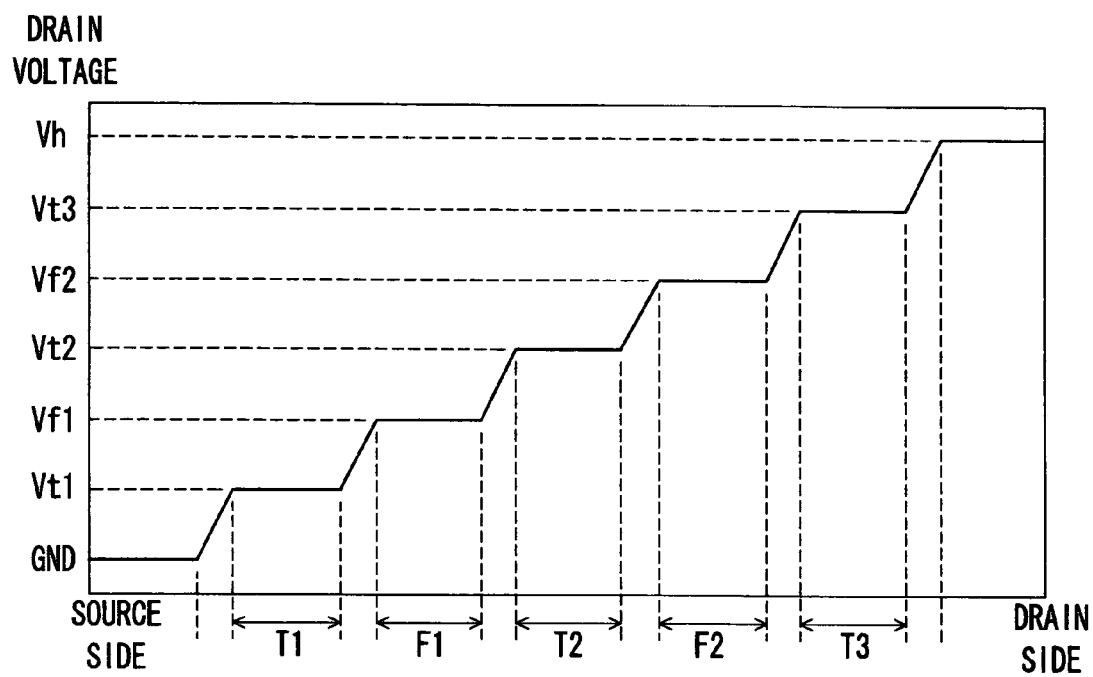
FIG. 11 is a distribution chart showing the potential between the source and the drain of the device in the cross section taken on line E-E' of FIG. 9.

FIG. 9 is a sectional view showing the structure of the trench side wall field plate of the trench capacitance coupling region in the level shift wire region 404, that is, a sectional view of the level shift wire region 404, taken on line E-E' of FIG. 8B. For the purpose of electrically connecting the epitaxial region between the trenches to the epitaxial region located inside the trench, being in the floating potential state and forming the trench side wall field plate, the aluminum electrode 10 is formed on the epitaxial region inside the trench between the zone F1 and the zone F2 and connected to the epitaxial region between the trenches. FIG. 10 is a sectional view of the level shift wire region 404, taken on line F-F' of FIG. 8B. As shown in FIG. 10, the aluminum electrode 10 is formed on the epitaxial region inside the trench and connected to the epitaxial region between the trenches. In this way, the trench capacitance coupling region of the level shift wire region 404, in which capacitance coupling is formed between GND and the potential Vh of the high-potential island 402, is disposed at zone T1, zone F1, zone T2, zone F2 and zone T3. With this configuration, the potential between the source and the drain in the cross section taken on line F-E' of FIG. 8B and shown in FIG. 9 can be changed step by step as shown in FIG. 11. Hence, in the semiconductor device according to Embodiment 1 configured as described above, the region in the cross section taken on line E-E' of FIG. 8B and shown in FIG. 9, can function as a field plate for the N-channel MOSFET.

FIGS. 12A to 12E, FIGS. 13A to 13F, FIGS. 14A to 14E and FIGS. 15A to 15F show process flows for producing the trench side wall field plate of the level shift wire region 404 in the HVIC according to Embodiment 1. In the process flows shown in FIGS. 12A to 12E and FIGS. 13A to 13F, the position of the cross section is the same as the position of the cross section shown in FIG. 9 described above, and states in the middle of production in the cross section taken on line E-E' of FIG. 8B are shown. In the process flows shown in FIGS. 14A to 14E and FIGS. 15A to 15F, the position of the cross section is the same as the position of the cross section shown in FIG. 10 described above, and states in the middle of production in the cross section taken on line F-F' of FIG. 8B are shown. The states shown in FIGS. 12A to 12E and FIGS. 14A to 14E are formed at the same production steps, and the states shown in FIGS. 13A to 13F and FIGS. 15A to 15F are formed at the same production steps.

A method for producing the trench side wall field plate will be described below using FIGS. 12A to 12E and FIGS. 14A to 14E, and FIGS. 13A to 13F and FIGS. 15A to 15F.

In FIGS. 12A to 12E and FIGS. 14A to 14E, FIGS. 12A and 14A show states obtained after an oxide film is formed and the oxide film is subjected to anisotropic etching. At the step up to the states shown in FIGS. 12A and 14A, an oxide film having a thickness of approximately 500 nm, such as a CVD oxide film or a thermal oxide film, is formed on the N⁻-type epitaxial layer 3. Then, a resist 20 is applied and photo engraving is carried out. At this time, the oxide film is subjected to anisotropic etching.

FIGS. 12B and 14B show states obtained after Si anisotropic etching is carried out. At steps up to the states shown in FIGS. 12B and 14B, the resist 20 is removed, and Si anisotropic etching is carried out.

FIGS. 12C and 14C show states obtained after the trench side wall is oxidized. At steps up to the states shown in FIGS. 12C and 14C, an oxide film 21 having a thickness of approximately 500 nm is removed, and a thermal oxide film is formed. The film thickness dt obtained at this time is made equal to the width dt of the resist 20 that is applied to form the trench side wall at the step shown in FIGS. 12A and 14A described above.

FIGS. 12D and 14D show states obtained after polysilicon accumulation. At steps up to the states shown in FIGS. 12D and 14D, polysilicon is buried inside the trench and accumulated up to distance dw from the surface (uppermost surface) of the oxide film for forming the trench side wall. This distance dw is equal to the width of the trench opening (see FIG. 14A).

FIGS. 12E and 14E show states obtained after the accumulated polysilicon is subjected to Si anisotropic etching. In the anisotropic etching for polysilicon at steps up to the states shown in FIGS. 12E and 14E, etching is carried out in the distance of approximately dw from the surface (uppermost surface) of the oxide film for forming the trench side wall, that is, the surface of the polysilicon.

Next, the process flows shown in FIGS. 13A to 13F and FIGS. 15A to 15F are carried out, and the trench side wall field plate is produced.

Figure 13A:
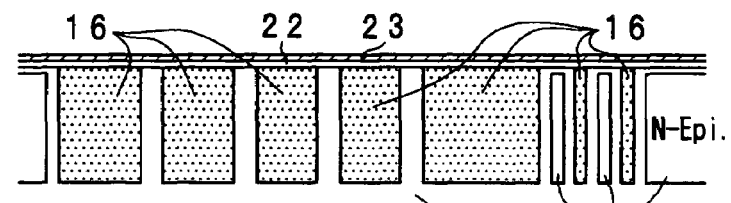
FIGS. 13A to 13F are views showing process flows for producing the trench side wall field plate structure of the semiconductor device according to Embodiment 1.
Figure 15A:
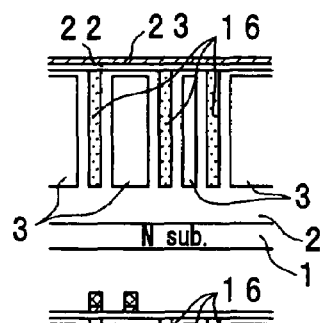
FIGS. 15A to 15F are views showing process flows for producing the trench side wall field plate structure of the semiconductor device according to Embodiment 1.

FIGS. 13A and 15A show states in which a surface oxide film 22 is formed, and then a nitride film 23 is formed. At steps up to the states shown in FIGS. 13A and 15A, the surface oxide film 22 having a thickness of approximately 100 nm is formed, and the nitride film 23 having a thickness of approximately 100 nm is accumulated.

Figure 13B:
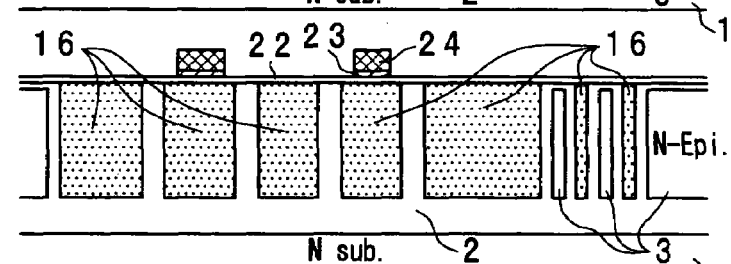
Figure 15B:
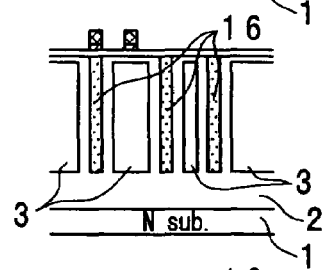

FIGS. 13B and 15B show states obtained after the nitride film 23 is etched. At steps up to the states shown in FIGS. 13B and 15B, a resist 24 is applied and photo engraving is carried out. Then, the nitride film 23 is etched.

Figure 13C:
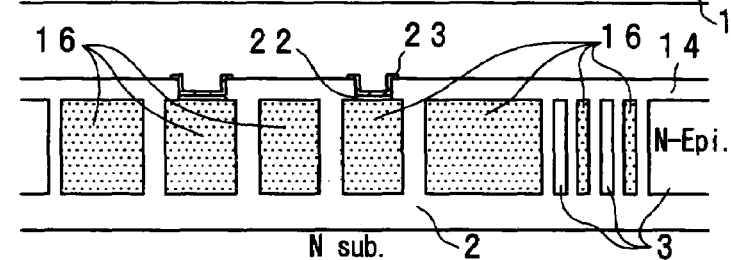
Figure 15C:
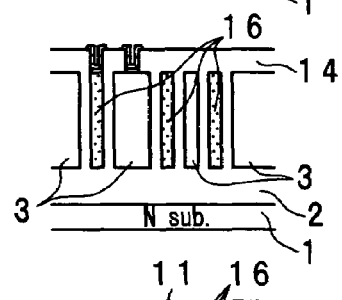

FIGS. 13C and 15C show states obtained after the field oxide film (LOCOS film) 14 is formed. At steps up to the states shown in FIGS. 13C and 15C, a resist is applied, and the field oxide film (LOCOS film) 14 is formed. The thickness of the field oxide film (LOCOS film) 14 is approximately 1 μm.

Figure 13D:
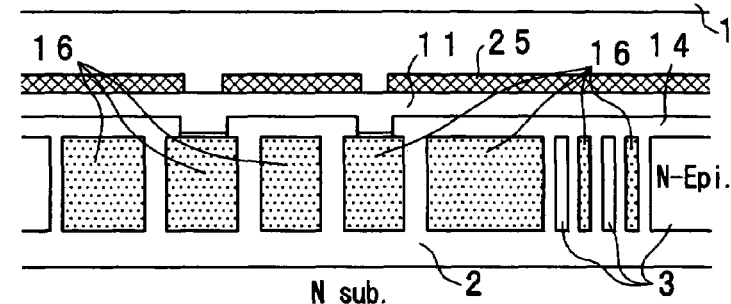
Figure 15D:
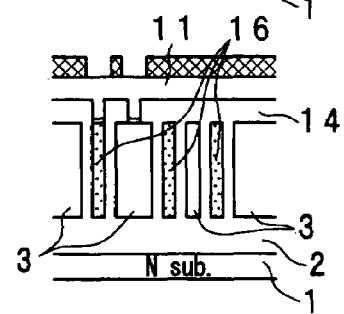

FIGS. 13D and 15D show states obtained after an interlayer oxide film 25 is formed. At steps up to the states shown in FIGS. 13D and 15D, the nitride film 23 is removed, and the interlayer oxide film 25 having a thickness of approximately 1 μm is formed by accumulation. Then, a resist is applied, and photo engraving is carried out.

Figure 13E:
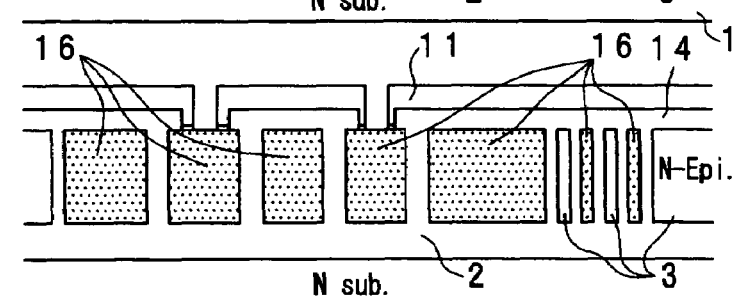
Figure 15E:
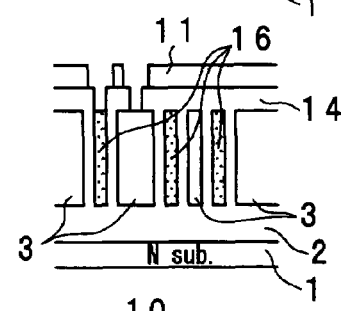

FIGS. 13E and 15E show states obtained after the interlayer oxide film 25 is subjected to patterning. At steps up to the states shown in FIGS. 13E and 15E, the interlayer oxide film 25 is subjected to anisotropic etching, and the resist is removed.

Figure 13F:
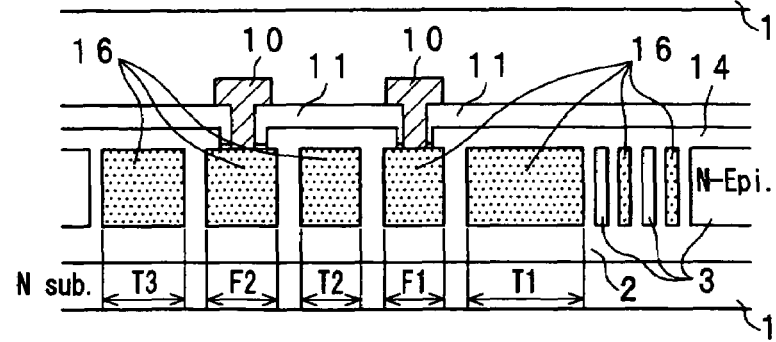
Figure 15F:
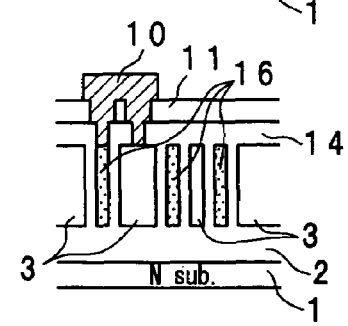

FIGS. 13F and 15F show states obtained after the aluminum wires are formed. In the states, the trench side wall field plate is completed. At steps up to the states shown in FIGS. 13F and 15F, an AlSiCu film having a thickness of approximately 1 μm is formed by sputtering. Then, a resist is applied, and photo engraving is carried out. The AlSiCu film is subjected to anisotropic etching, and the aluminum electrodes 10 are formed. Then, the resist is removed, and the trench side wall field plate is completed.

The trench side wall field plate structure in the HVIC according to Embodiment 1 is produced reliably by carrying out the steps shown in FIGS. 12A to 12E, FIGS. 13A to 13F, FIGS. 14A to 14E and FIGS. 15A to 15F as described above.

It is preferable that each trench separation region, serving as the trench side wall field plate, at zone T1, zone F1, zone T2, zone F2 and zone T3 should be oxidized and configured so as not to include Si regions as few as possible to prevent current leakage. In addition, when it is assumed that the thickness of the oxide film of the trench side wall is dt, it is preferable that patterning should be carried out so that the distance between the trenches at the steps shown in FIGS. 12A and 14A in which the trenches are formed in the N⁻-type epitaxial layer 3 by anisotropic etching is approximately dt.

Embodiment 2

Figure 16:
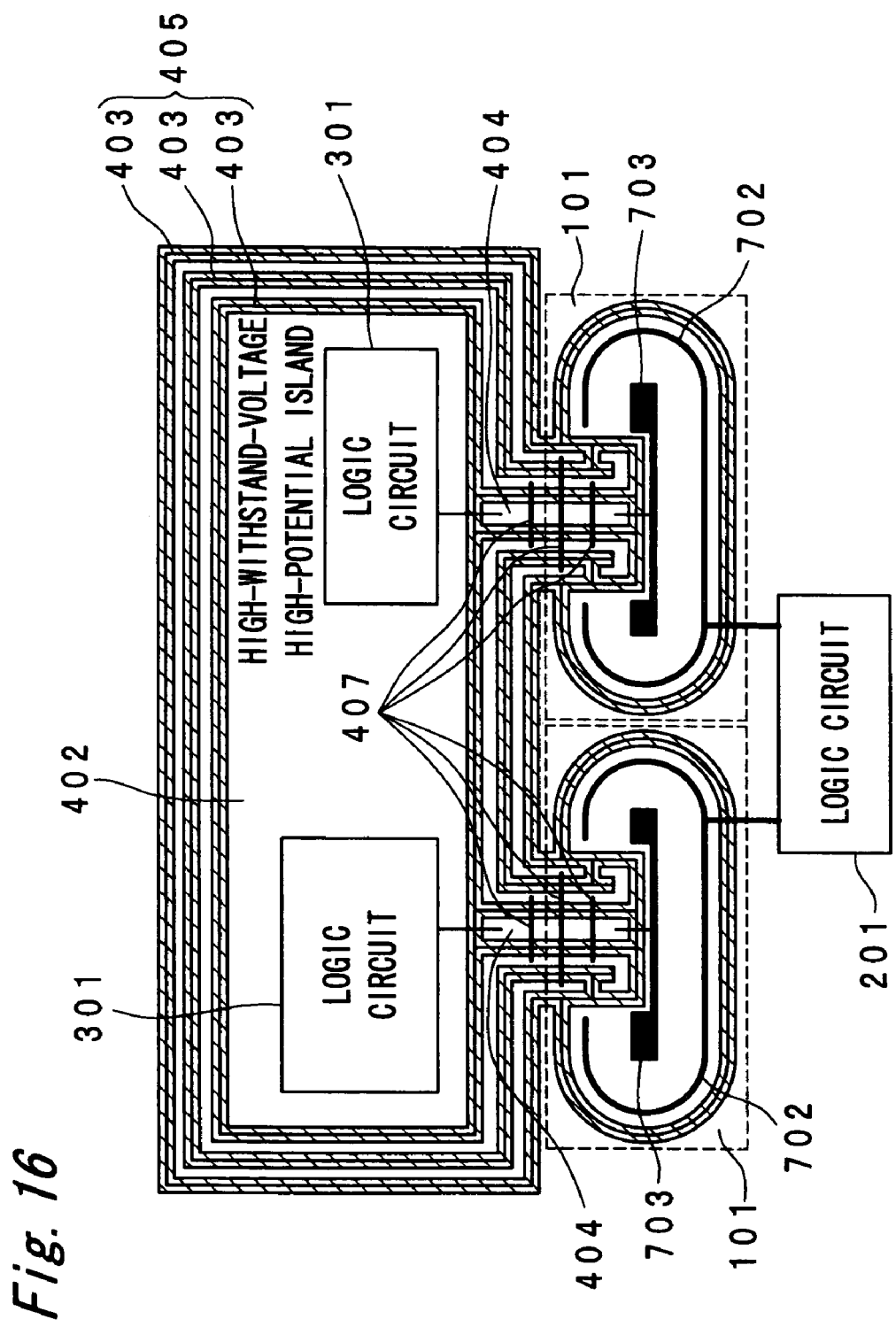
FIG. 16 is a plan view showing a semiconductor device according to Embodiment 2.

A semiconductor device according to Embodiment 2 of the present invention will be described below referring to the accompanying drawings. FIG. 16 is a plan view showing a power integrated circuit device (HVIC) serving as the semiconductor device according to Embodiment 2. FIG. 16 schematically shows the HVIC to facilitate its explanation, and the sizes of its components and the spaces between them are different from those of an actual device. The HVIC according to Embodiment 2 has a configuration in which two or more high-withstand voltage N-channel MOSFETs 101 each having the level shift wire region 404 of the HVIC according to Embodiment 1 described above are arranged. FIG. 16 shows a configuration in which two high-withstand voltage N-channel MOSFETs 101 are arranged. In the HVIC according to Embodiment 2, the epitaxial regions and the polysilicon regions between the trench separation regions, divided using the level shift wire regions 404 are connected using aluminum wires 407, whereby electrical continuity is maintained.

As shown in FIG. 16, the region held between the two high-withstand voltage N-channel MOSFETs 101 and 101 in the multi-trench separation region 405 is a pattern having no continuity to the other regions. Hence, there is a possibility that a difference may occur in the potential distribution inside the multi-trench separation region 405. In the case that a difference occurs in the potential distribution inside the multi-trench separation region 405, the potential of the trench side wall field plate, formed so as to be bilaterally symmetrical, becomes unsymmetrical in the level shift wire region 404 in which the level shift wires are formed. This causes a problem of making the withstand voltage of the device unstable.

Hence, in the HVIC according to Embodiment 2, as shown in FIG. 16, the regions between the trench separation regions 403 corresponding to each other in the multi-trench separation region 405 are connected using the aluminum wires 107. Therefore, the electrical continuity of the potential in the trench side wall field plate is maintained, whereby a configuration capable of stabilizing the withstand voltage of the device is obtained.

Embodiment 3

Figure 17:
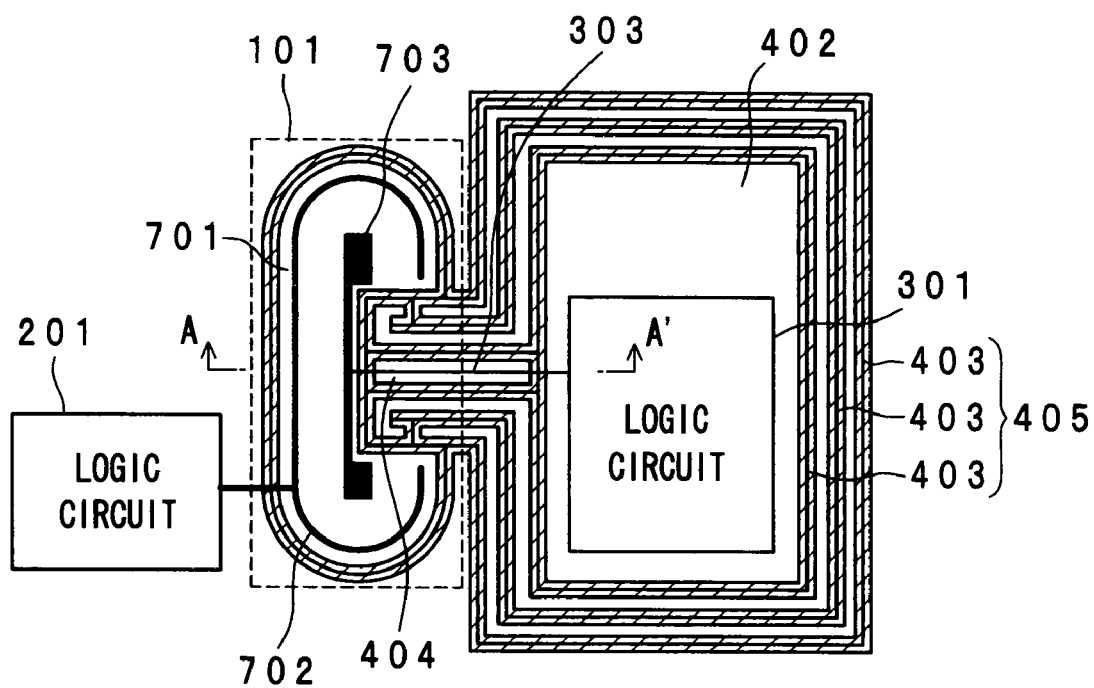
FIG. 17 is a plan view showing a semiconductor device according to Embodiment 3.
Figure 18:
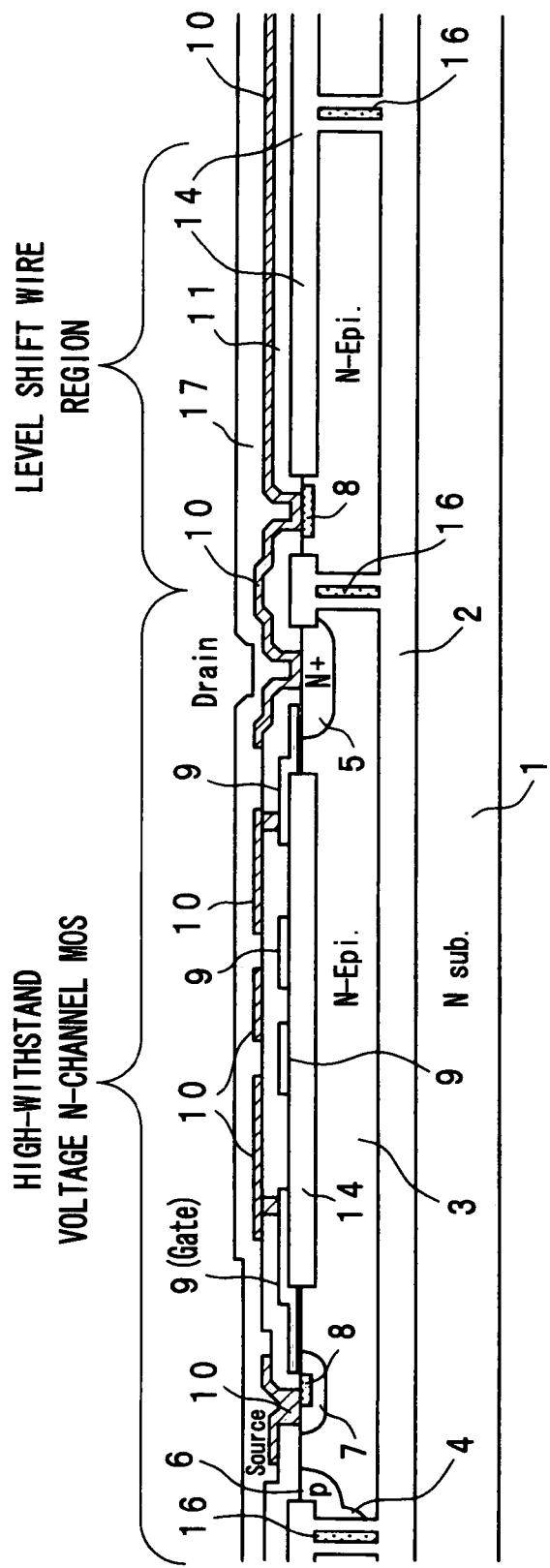
FIG. 18 is a sectional view of the semiconductor device, taken on line A-A' of FIG. 17.

A semiconductor device according to Embodiment 3. of the present invention will be described below referring to the accompanying drawings. FIG. 17 is a plan view showing a power integrated circuit device (HVIC) serving as the semiconductor device according to Embodiment 3. FIG. 17 schematically shows the HVIC to facilitate its explanation, and the sizes of its components and the spaces between them are different from those of an actual device. FIG. 18 is a sectional view of the HVIC, taken on line A-A' of FIG. 17.

In the HVIC according to the aforementioned Embodiment 1, the high-potential island 402 is separated using the multi-trench separation region 405, and the central trench in the level shift wire region 404 of the multi-trench separation region 405 is used as a level shift wire. In the case of this configuration, the resistance of the N-type epitaxial layer 3 is inserted as a wiring resistance, thereby constituting a restriction on the circuit configuration.

Hence, in the HVIC according to Embodiment 3, the high-potential island 402 is separately formed using the multi-trench separation region 405. However, an aluminum wire 303 is formed on the surface of the central trench serving as the high-potential trench separation region 403 of the level shift wire region 404 that is held between the high-potential island 402 and the drain electrode 703 of the high-withstand voltage N-channel MOSFET 101. This aluminum wire 303 makes contact with the high-potential trench separation region 403 and electrically connects the drain electrode 703 of the N-channel MOSFET 101 to the high-potential-side logic circuit 301 inside the high-potential island 402. In the configuration of the HVIC according to Embodiment 3, the wiring resistance can be made smaller, whereby the restriction on the circuit configuration can be reduced.

Embodiment 4

Figure 19:
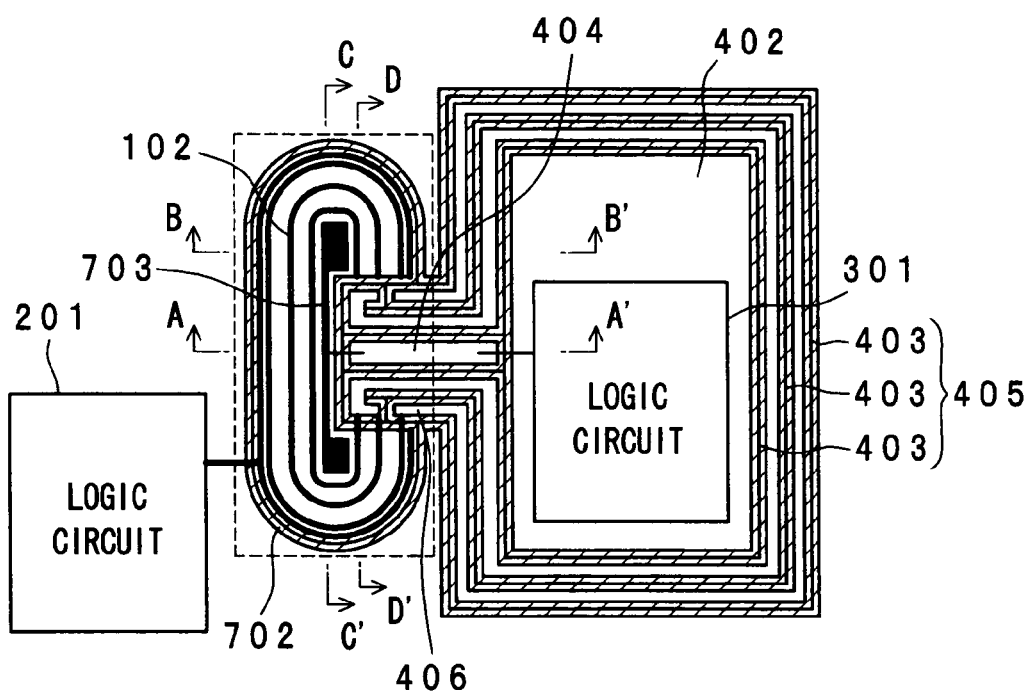
FIG. 19 is a plan view showing a semiconductor device according to Embodiment 4.

A semiconductor device according to Embodiment 4 of the present invention will be described below referring to the accompanying drawings. FIG. 19 is a plan view showing a power integrated circuit device (HVIC) serving as the semiconductor device according to Embodiment 4. FIG. 19 schematically shows the HVIC to facilitate its explanation, and the sizes of its components and the spaces between them are different from those of an actual device.

In the HVIC according to Embodiment 4, a multiple field plate 102 formed between the source and the drain of the high-withstand voltage N-channel MOSFET is connected to the trench side wall field plate 406 in the level shift wire region 404. As an advantages of this structure, the potential of the multiple field plate 102 becomes stable, whereby the withstand voltage of the high-withstand voltage N-channel MOSFET device 101 is stabilized. Furthermore, because the electrical continuity of the multi-trench separation region 405 can be obtained via the multiple field plate 102, a similar effect can also be obtained even in the case that multiple semiconductor devices are used as in the case of the HVIC according to the aforementioned Embodiment 2.

Figure 20:
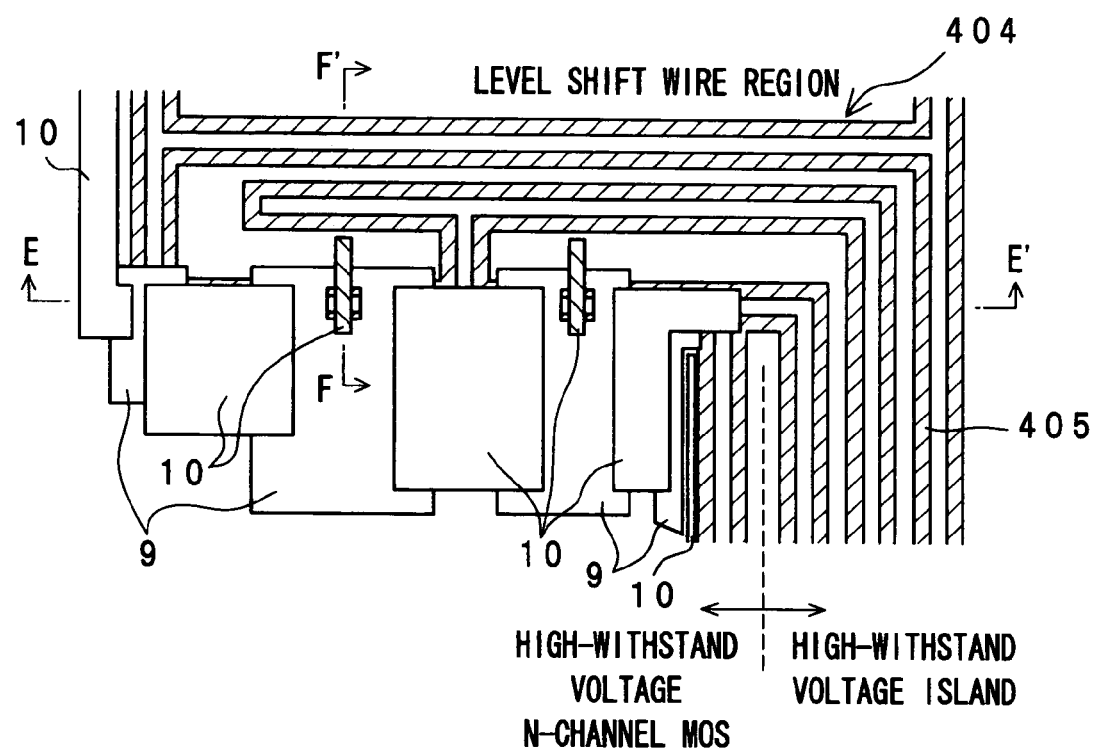
FIG. 20 is a view showing the structure of the connection between the trench side wall field plate 406 and the multiple field plate 102 (surface field plate) of the semiconductor device according to Embodiment 4.
Figure 21A:
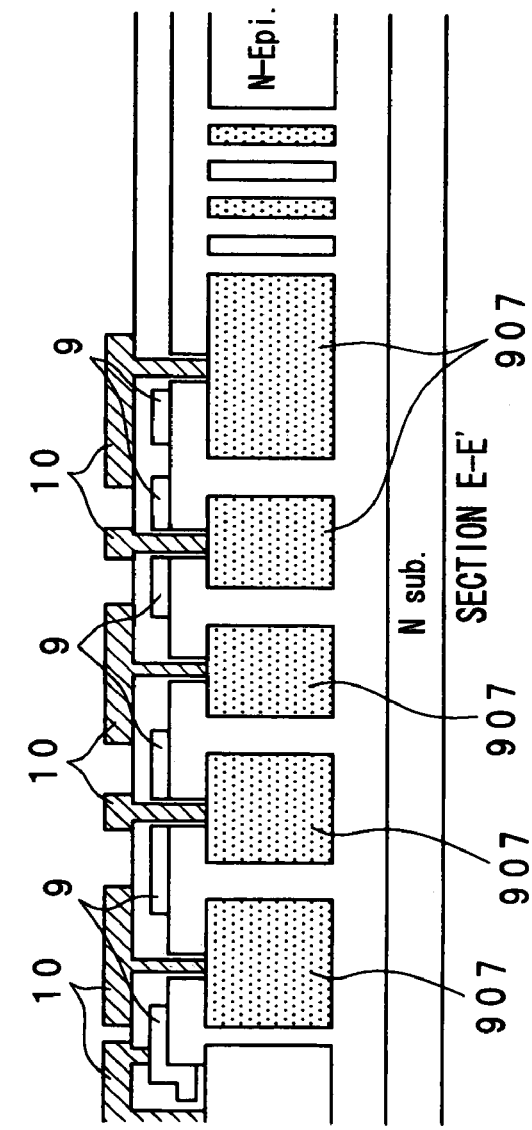
FIG. 21A is a sectional view of the semiconductor device, taken on line E-E' of FIG. 20.
Figure 21B:
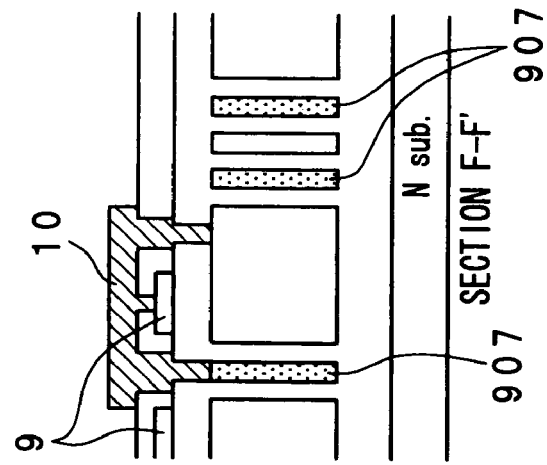
FIG. 21B is a sectional view of the semiconductor device, taken on line F-F' of FIG. 20.

FIG. 20 is a view showing the structure of the connection between the trench side wall field plate 406 and the multiple field plate 102 (surface field plate) FIG. 21A is a sectional view of the trench capacitance coupling region in the level shift wire region 404, taken on line E-E' of FIG. 20, and FIG. 21B is a sectional view of the level shift wire region 404, taken on line F-F' of FIG. 20.

In the semiconductor device according to Embodiment 4, the multiple field plate 102 (surface field plate) comprises a polysilicon portion and the aluminum electrode 10. The aluminum electrode 10 of the multiple field plate 102 is directly connected to, the polysilicon region 907 inside the trench capacitance coupling region in the level shift wire region 404. Furthermore, the polysilicon portion of the multiple field plate 102 is connected to the polysilicon region 907 inside the level shift wire region 404 via the aluminum electrode 10.

Embodiment 5

Figure 22:
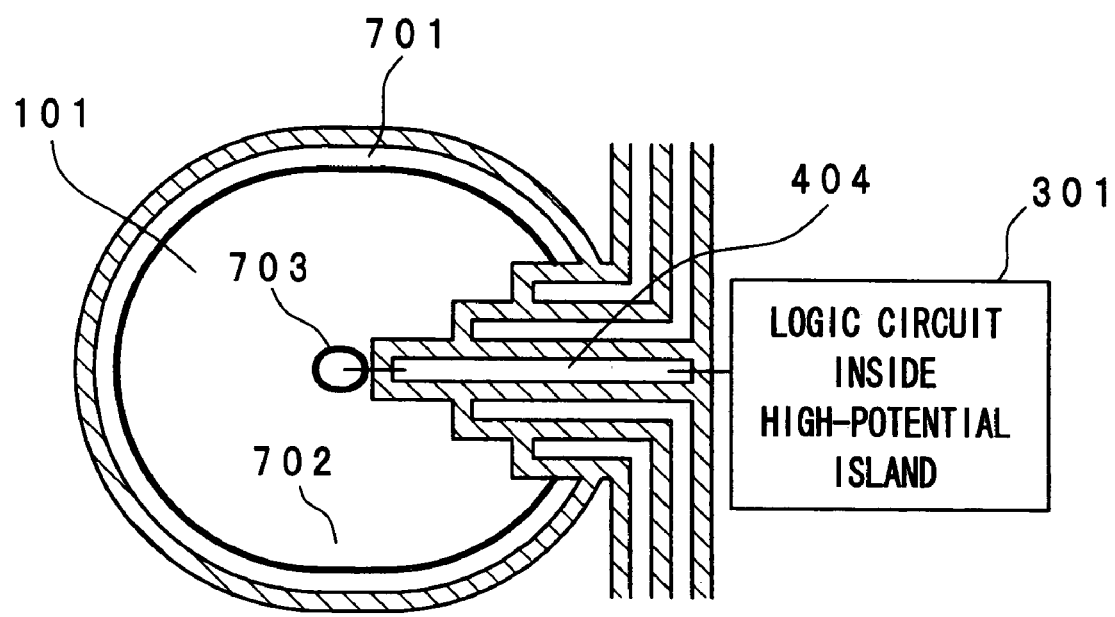
FIG. 22 is a plan view showing a semiconductor device according to Embodiment 5.

A semiconductor device according to Embodiment 5 of the present invention will be described below referring to the accompanying drawings. FIG. 22 is a plan view showing a power integrated circuit device (HVIC) serving as the semiconductor device according to Embodiment 5. FIG. 22 schematically shows the HVIC to facilitate its explanation, and the sizes of its components and the spaces between them are different from those of an actual device.

In the HVIC according to Embodiment 5, the drain electrode 703 of the high-withstand voltage N-channel MOSFET 101 having a circular shape is formed into a small circle at the center of the N-channel MOSFET. The drain electrode 703 having the circular shape and disposed at a nearly central position of the high-withstand voltage N-channel MOSFET 101 is electrically connected to the logic circuit 301 of the high-potential island using the level shift wire region 404 of the multi-trench separation region 405. The circumferential distance of the circular shape is smaller as the location is nearer to the center thereof. Because the high-withstand voltage N-channel MOSFET 101 of the HVIC according to Embodiment 5 is formed into a nearly circular shape, the electrode pattern at the central portion can be formed simply.

The high-withstand voltage N-channel MOSFET 101 according to Embodiment 5 can be configured by extending and disposing only the trench side wall field plate of the high-potential trench separation region 403 located at the center of the level shift wire region 404 between the source and the drain using such a simple pattern as shown in FIG. 22, without having such a complicated configuration as shown in the plan view of FIG. 1 in the aforementioned Embodiment 1.

Embodiment 6

A power integrated circuit device (HVIC) serving as a semiconductor device according to Embodiment 6 of the present invention is configured that the resistance value in the N$^-$-type epitaxial region between the trench separation regions is reduced, whereby rising in potential owing to a parasitic resistance component is prevented. The configuration of Embodiment 6 is applicable to the semiconductor devices according to all the embodiments of the present invention.

In the HVIC according to Embodiment 6, a P$^+$-type diffusion layer or an N$^+$-type diffusion region is formed in the N$^-$-type epitaxial region between the trench separation regions before or after the multi-trench separation region 405 (for example, see FIG. 1) is formed. Because the P$^+$-type diffusion layer or the N$^+$-type diffusion region is formed as described above, the resistance value in the N$^-$-type epitaxial region between the trench separation regions can be reduced, and rising in potential owing to a parasitic resistance component can be prevented.

Embodiment 7

Figure 23:
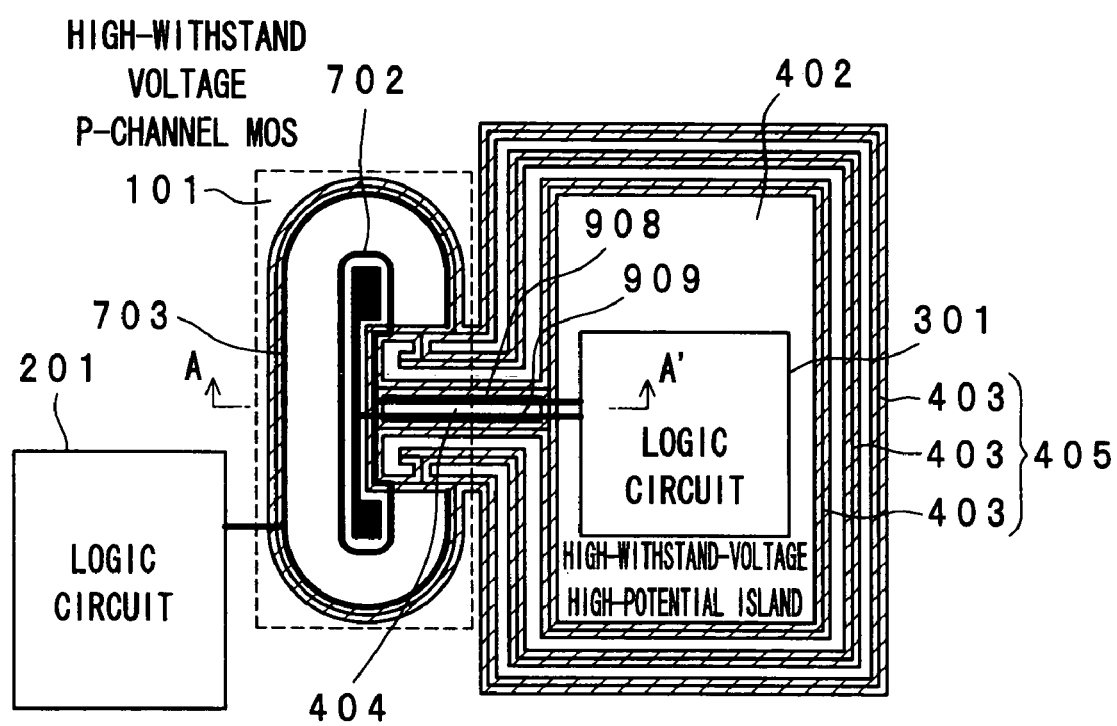
FIG. 23 is a plan view showing a semiconductor device according to Embodiment 7.
Figure 24:
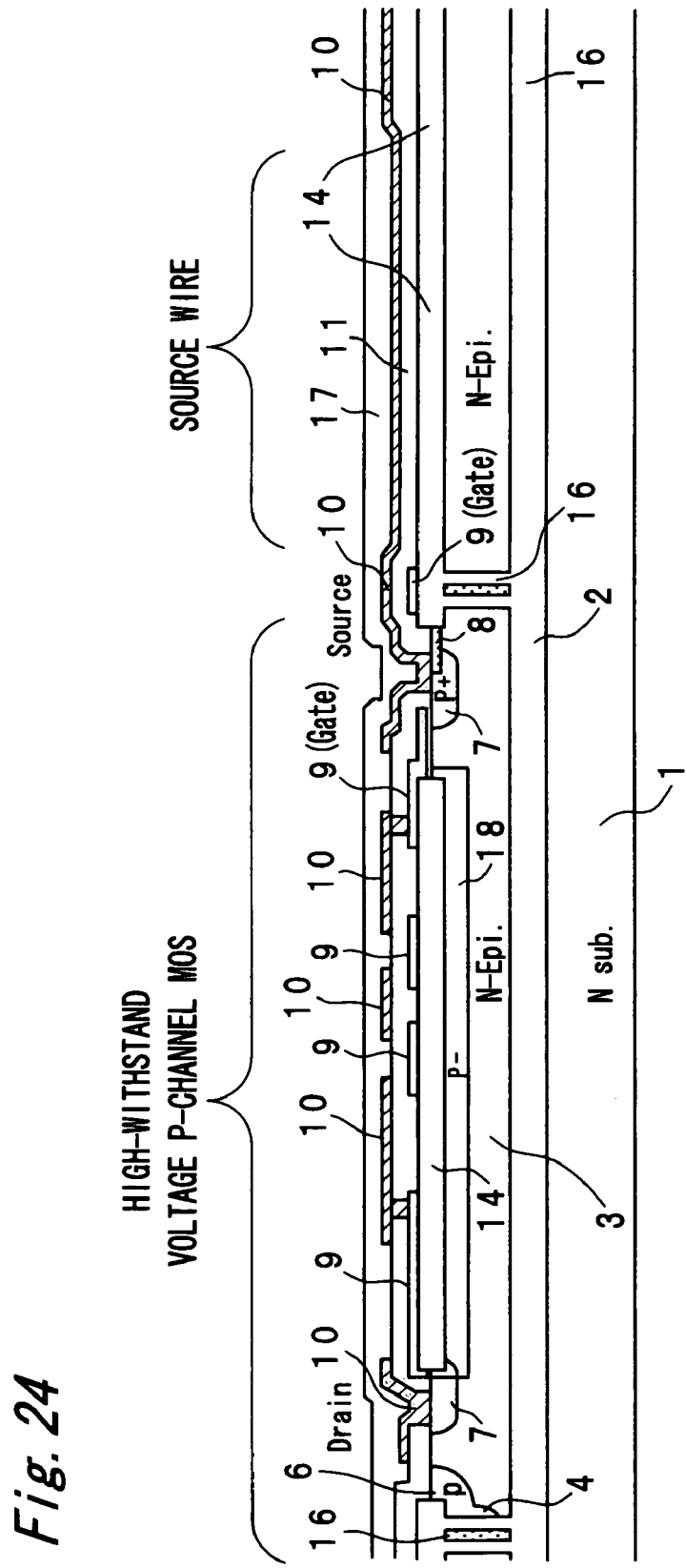
FIG. 24 is a sectional view of the source wire of the semiconductor device according to Embodiment 7.
Figure 25:
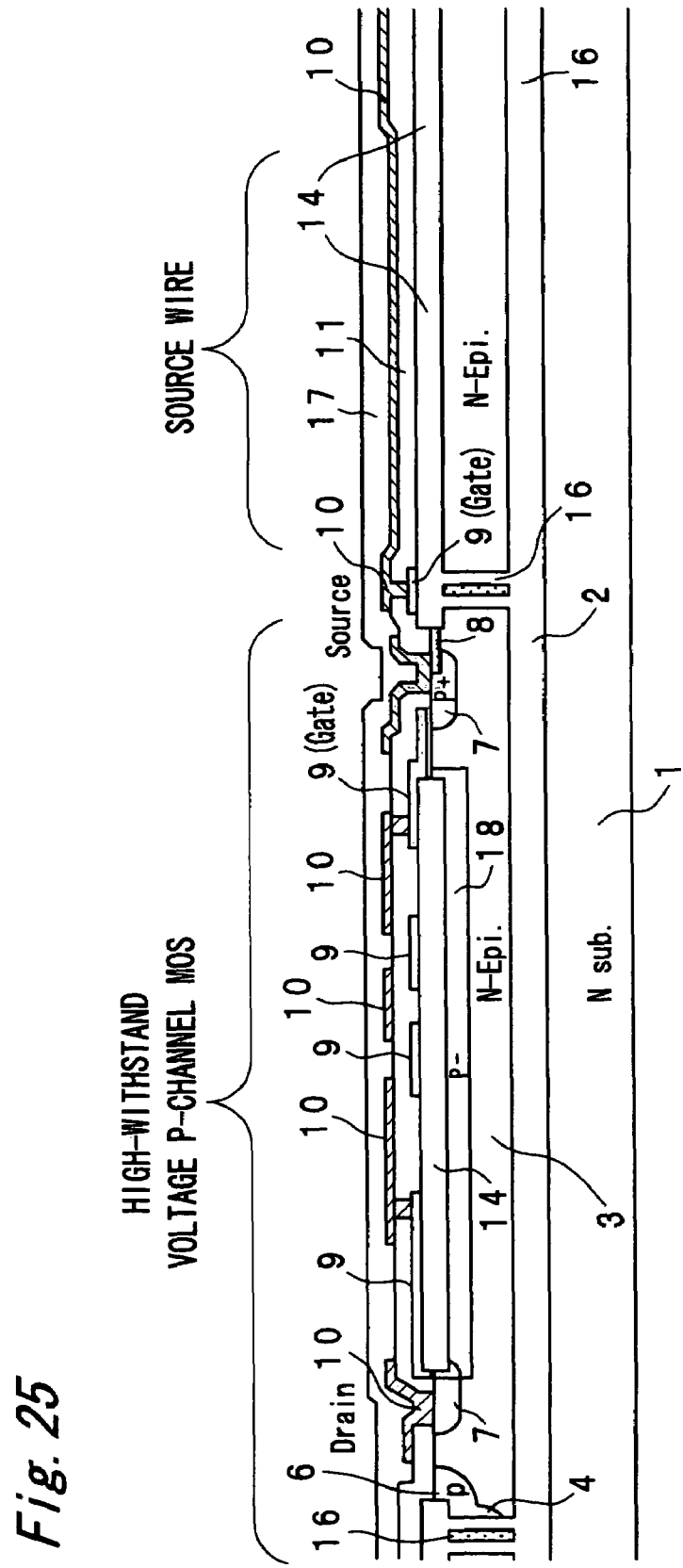
FIG. 25 is a sectional view of the gate wire of the semiconductor device according to Embodiment 7.

A semiconductor device according to Embodiment 7 of the present invention will be described below referring to the accompanying drawings. FIG. 23 is a plan view showing a power integrated circuit device (HVIC) serving as the semiconductor device according to Embodiment 7. FIG. 23 schematically shows the HVIC to facilitate its explanation, and the sizes of its components and the spaces between them are different from those of an actual device. FIG. 24 shows the cross section structure of the source wire portion 908 of the level shift wire region 404 according to Embodiment 7, and FIG. 25 shows the cross section structure of the gate wire portion 909 of the level shift wire region 404 according to Embodiment 7.

In the HVIC according to Embodiment 7, the high-withstand voltage N-channel MOSFET 101 is used. The high-withstand voltage N-channel MOSFET 101 transmits a signal from the logic circuit 301 of the high-voltage region of the high-potential island 402 to the logic circuit 201 of the low-voltage region, and the signal is used for reverse level shift operation. In the HVIC according to Embodiment 7, the level shift wires in the level shift wire region 404, to which high potentials are applied, are used to connect the logic circuit 301 of the high-potential island 402 to the gate electrode 702 and the source electrode 701 of the high-withstand voltage N-channel MOSFET 101. The level shift wires in the level shift wire region 404 are the aluminum electrodes 10. In the HVIC according to Embodiment 7 configured as described above, the aluminum electrodes 10 to which high potentials are applied do not intersect with the low-potential regions.

Embodiment 8

Figure 26:
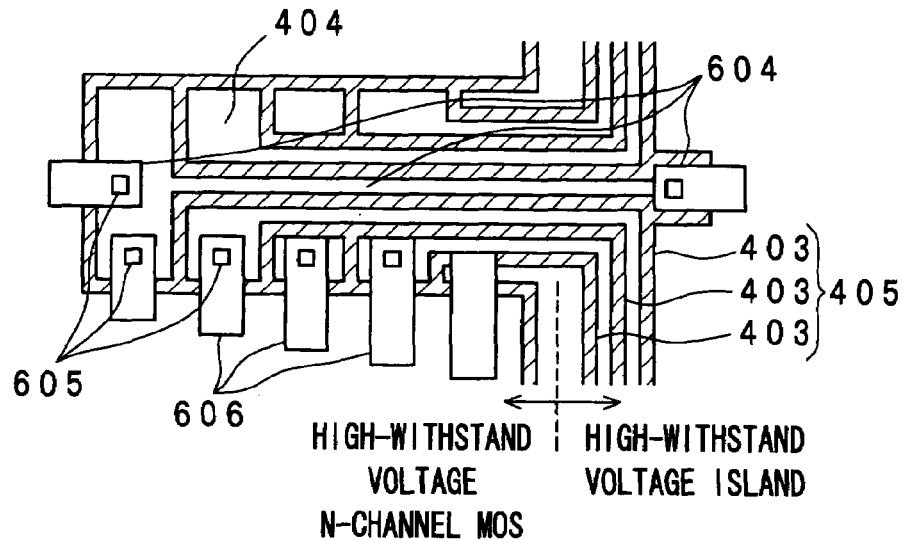
FIG. 26 is a view showing the structure of the trench side wall field plate and the level shift wires of the semiconductor device according to Embodiment 8.

A semiconductor device according to Embodiment 8 of the present invention will be described below referring to the accompanying drawings. FIG. 26 is a view showing the structure of the trench side wall field plate and the level shift wires of the power integrated circuit device (HVIC) serving as the semiconductor device according to Embodiment 8.

Usually, for the purpose of stress relaxation during processing, the interior of the trench is oxidized and filled with polysilicon. This is because the expansion coefficient of Si is different from that of $SiO_2$ serving as an oxide film. The interior of the trench having a wide width of 1 µm or more is filled with $SiO_2$ and polysilicon being the same material as Si to suppress the occurrence of excessive stress. In recent years, with the progress in microfabrication technology, a trench having a depth of 10 µm or more can be formed even when the width of the opening of the trench is 1 µm or less. Even when the interior of this kind of trench is filled with only $SiO_2$ serving as an oxide film using CVD, a trench separation region can be formed at low stress because the thickness of $SiO_2$ that is used for the filling is reduced.

Hence, in the semiconductor device according to Embodiment 8, the interior of the trench, being fine and deep, is filled with only an insulating film. Therefore, the complicated production steps shown in FIGS. 12A to 12E, FIGS. 13A to 13F, FIGS. 14A to 14E and FIGS. 15A to 15F of the aforementioned Embodiment 1 are not necessary. In this configuration, trench division that is carried out to prevent the polysilicon portions in multiple trenches from being connected mutually is not necessary. Hence, multiple trenches can be formed so as to have a configuration in which the trenches are intersected with one another. As an advantage of this configuration, a restriction requiring that the space between the trenches should be nearly equal to the thickness of the oxide film on the side wall of the trench to prevent current leakage between the trenches is eliminated in particular, and production is made easy.

As shown in FIG. 26, in the semiconductor device according to Embodiment 8, level shift wires 604 serving as the high-potential trench separation regions 403 are formed at the central portion of the level shift wire region 404. One terminal of each level shift wire 604 is connected to the logic circuit 301 of the high-voltage region, and the other terminal thereof is connected to a predetermined electrode of the high-withstand semiconductor device. In addition, in the semiconductor device according to Embodiment 8, a surface field plate 606 is connected to the trench side wall field plate 603 in the trench capacitance coupling region of the level shift wire region 404 by forming a contact 605. Hence, it is not necessary to form a contact on the polysilicon in the trench separation region, whereby pattern design can be made easy.

Embodiment 9

Figure 27:
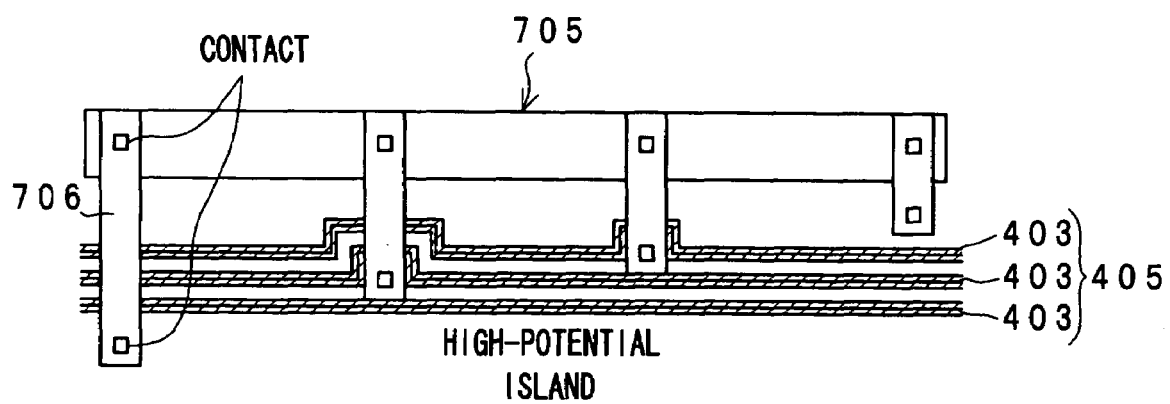
FIG. 27 is a view showing the configuration of the multi-trench separation region of a semiconductor device according to Embodiment 9.

A semiconductor device according to Embodiment 9 of the present invention will be described below referring to the accompanying drawings. The potential of the multi-trench separation region in the power integrated circuit device (HVIC) according to Embodiment 9 is stabilized. FIG. 27 is a view showing a configuration for stabilizing the potential of the multi-trench separation region of the HVIC according to Embodiment 9. In the HVIC according to Embodiment 9, a high-resistance polysilicon portion 705 is inserted between GND and the high-potential island in the multi-trench separation region. As shown in FIG. 27, in the multi-trench separation region 405 in the HVIC according to Embodiment 9, the high-resistance polysilicon portions 705 are connected in parallel with the trench separation regions 403 of the multi-trench separation region 405 using connection electrodes 706.

With this configuration, in the HVIC according to Embodiment 9, the potentials of the trench separation regions 403 in the multi-trench separation region 405 are shared evenly by capacitance coupling. Furthermore, the potentials of the trench separation regions 403 can be stabilized by connecting high resistors in parallel.

Embodiment 10

Figure 28:
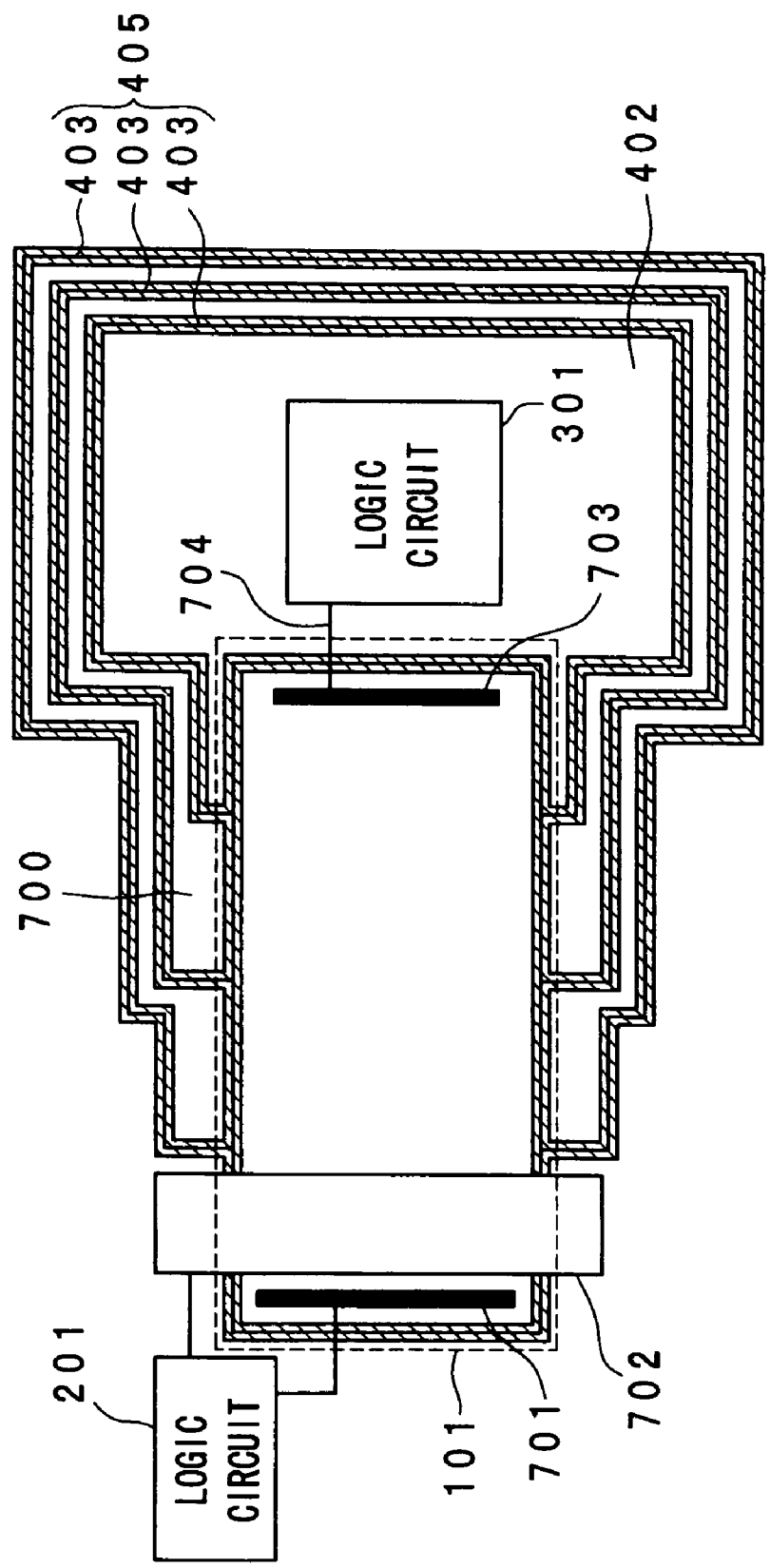
FIG. 28 is a plan view showing a semiconductor device according to Embodiment 10.

A semiconductor device according to Embodiment 10 of the present invention will be described below referring to the accompanying drawings. FIG. 28 is a plan view showing a power integrated circuit device (HVIC) serving as the semiconductor device according to Embodiment 10. FIG. 28 schematically shows the HVIC to facilitate its explanation, and the sizes of its components and the spaces between them are different from those of an actual device.

In the HVIC according to Embodiment 10, the high-withstand voltage N-channel MOSFET 101 is not formed into a circular shape but is formed into a rectangular shape having four straight sides, and is provided with trench side wall field plates 700 at portions in which the continuity at both ends is broken, that is, on the two opposed sides. The difference between the drain voltage of the high-withstand voltage N-channel MOSFET 101 and the voltage applied to the high-potential island 402 is small and equal to or less than the drive voltage, 25 V, of the high-potential-side logic circuit 301, even if the difference is at its maximum. For this reason, they can be adjacent across one trench separation region 403 as shown in the figure. Hence, the high-potential-side logic circuit 301 can be connected directly to the drain electrode 703 using an aluminum wire 704 that serves as a level shift wire as shown in the figure. In the HVIC according to Embodiment 10, the drain electrode 703 that is connected to the logic circuit 301 using the aluminum wire 704 is provided near one side of the high-withstand voltage N-channel MOSFET 101 having the rectangular shape, the side being close to the high-potential island 402. In addition, the source electrode 701 that is connected to the low-potential-side logic circuit 201 is provided near the opposed side, that is, the other side. Furthermore, the gate electrode 702 that is connected to the low-potential logic circuit 201 is provided while having a predetermined width so as to cross the N-channel MOSFET 101 in nearly parallel with the source electrode 701. In other words, the length of the gate electrode 702 is made longer than the length of one side of the N-channel MOSFET 101 having the rectangular shape but shorter than the total length of two sides thereof.

In the configuration of the HVIC according to Embodiment 10, the length of the gate electrode 702 of the high-withstand voltage N-channel MOSFET 101 can be set shorter than the length in the case that the pattern of the gate electrode 702 is formed into a circular shape. For this reason, for example, the level shift device can be formed compact.

Figure 29:
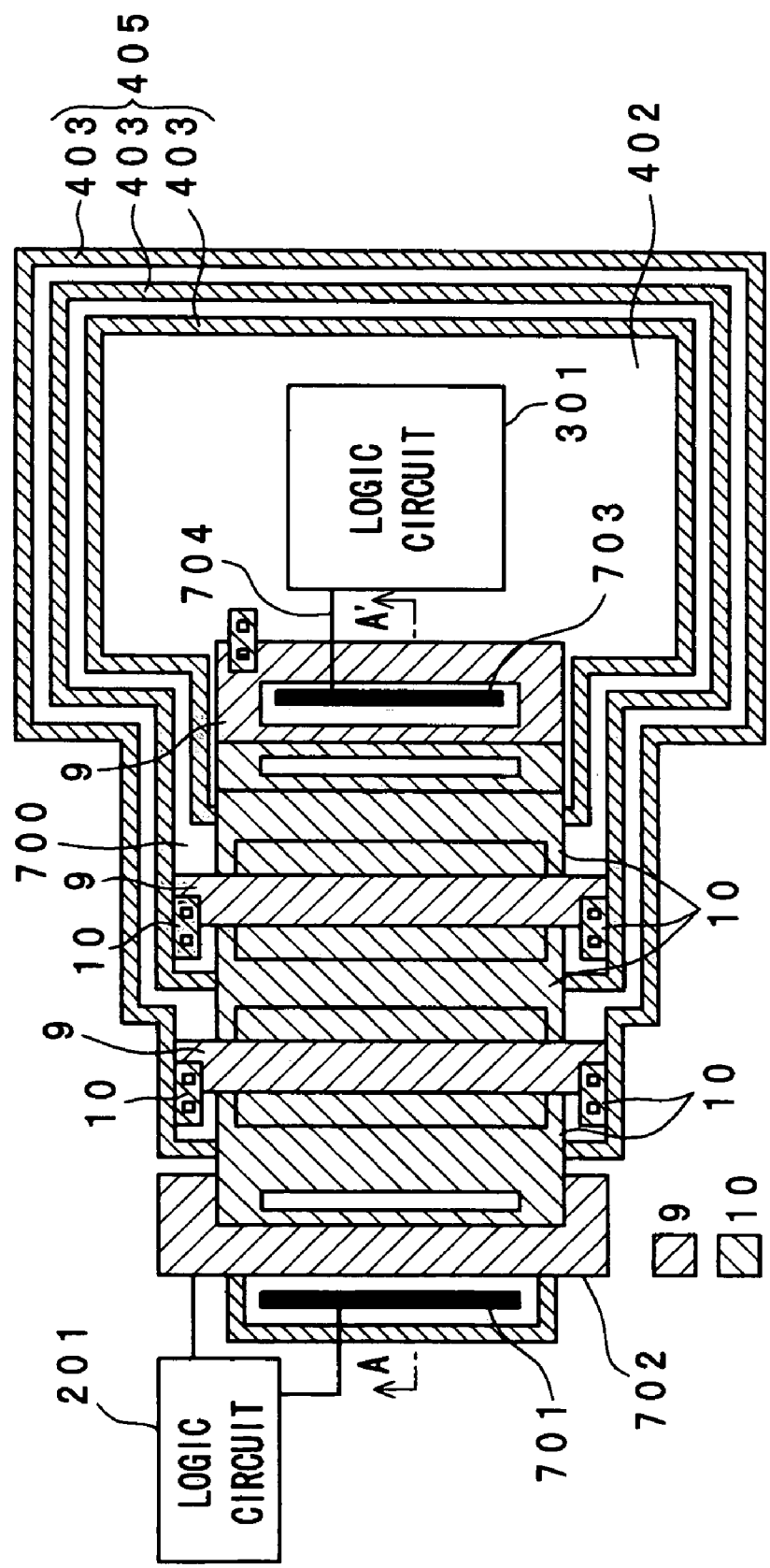
FIG. 29 is a plan view showing a configuration of the semiconductor device according to Embodiment 10 in which the trench side wall field plate is connected to the multiple field plates on the surface.
Figure 30:
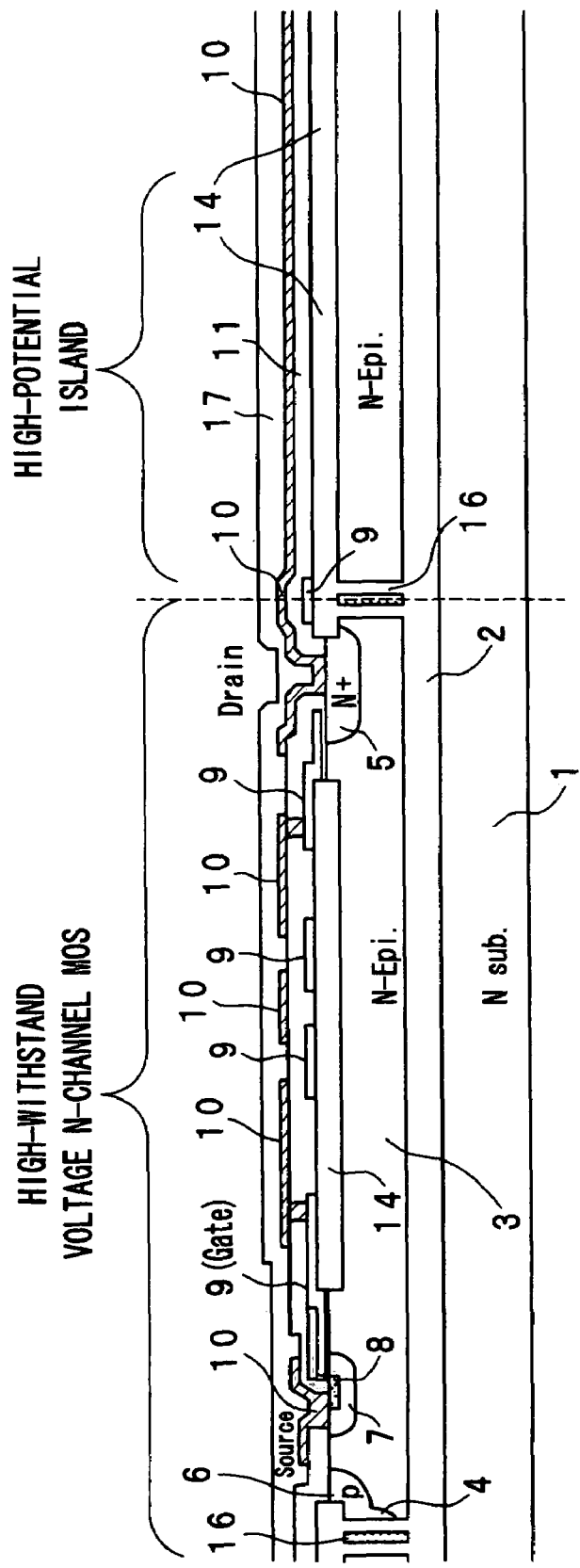
FIG. 30 is a sectional view of the semiconductor device, taken on line A-A' of FIG. 29.

FIG. 29 is a plan view showing a configuration of the HVIC according to Embodiment 10 in which the trench side wall field plate is connected to the multiple field plates on the surface. FIG. 30 is a sectional view showing the HVIC, taken on line A-A' of FIG. 29.

In Embodiment 10, an example in which the high-withstand voltage N-channel MOSFET 101 is used is described.

However, the HVIC can also be configured similarly using a high-withstand voltage P-channel MOSFET, and similar effects are obtained.

Embodiment 11

Figure 31:
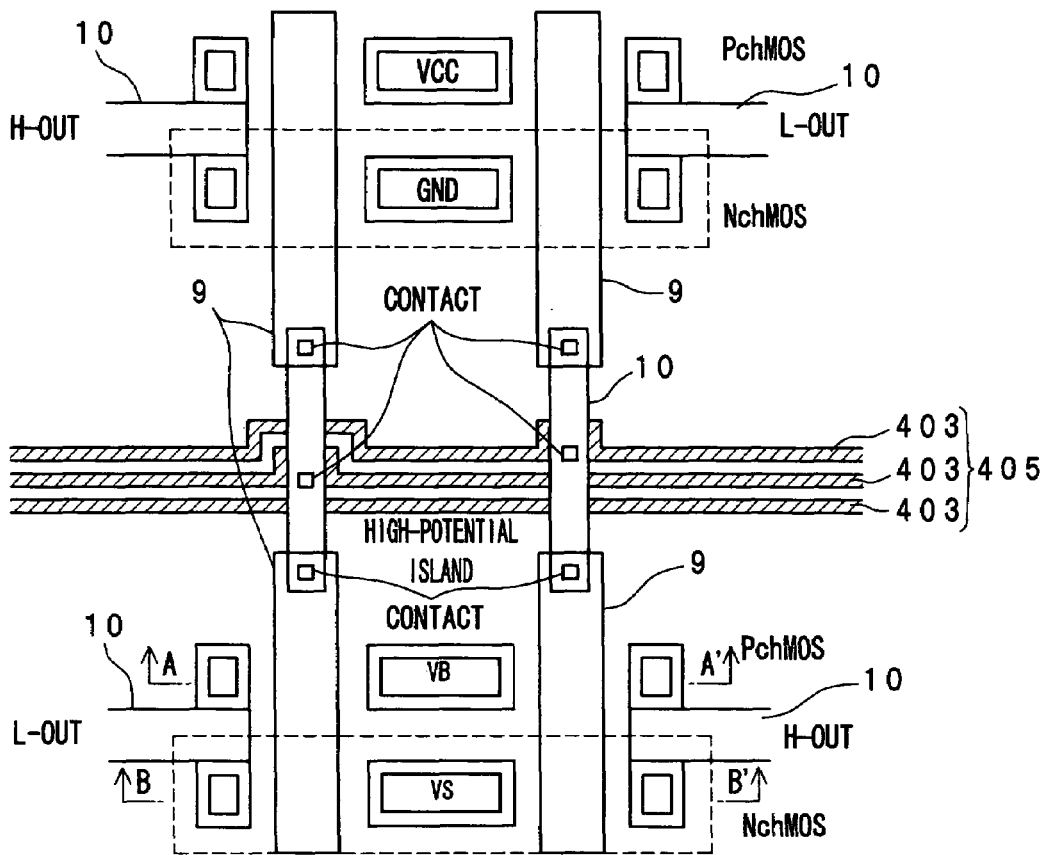
FIG. 31 is a view showing a configuration of a semiconductor device according to Embodiment 11 in which a method for detecting the potential of the multi-trench separation region is applied.
Figure 32:
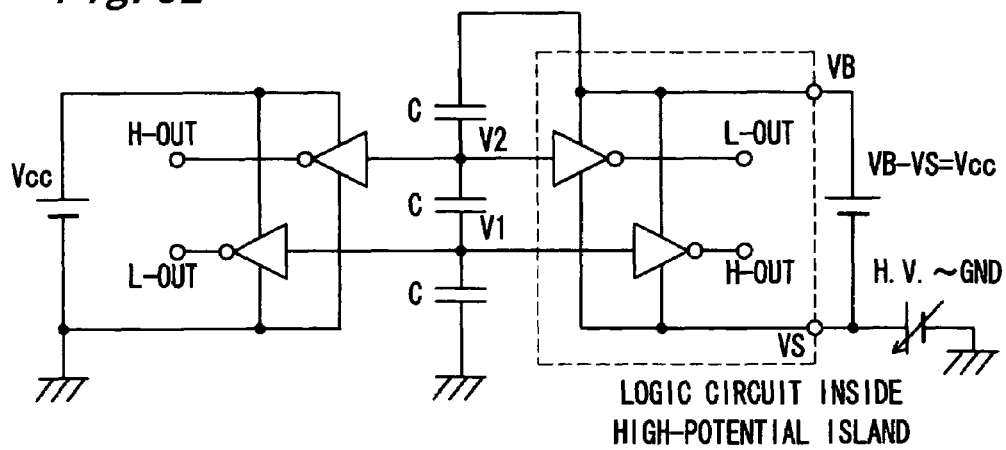
FIG. 32 shows an equivalent circuit in an example of the semiconductor device shown in FIG. 31.
Figures 33A, 33B:
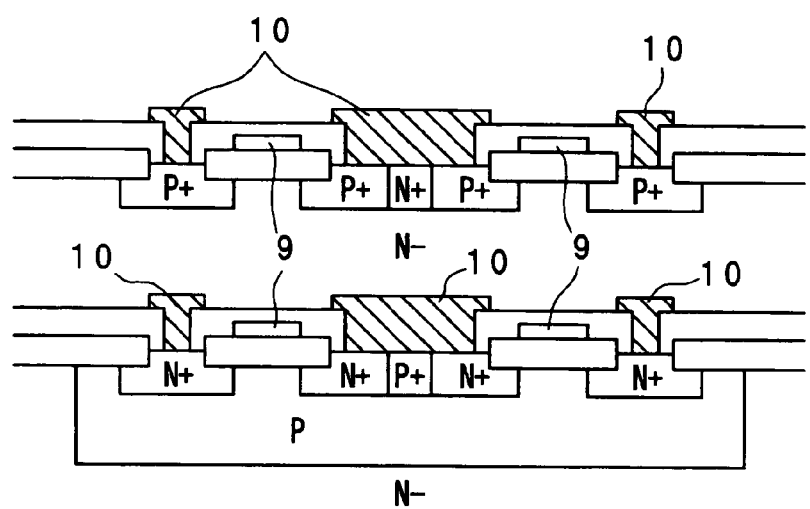
FIG. 33A is a sectional view of the semiconductor device, taken on line A-A' of FIG. 31.
FIG. 33B is a sectional view of the semiconductor device, taken on line B-B' of FIG. 31.
Figure 34:
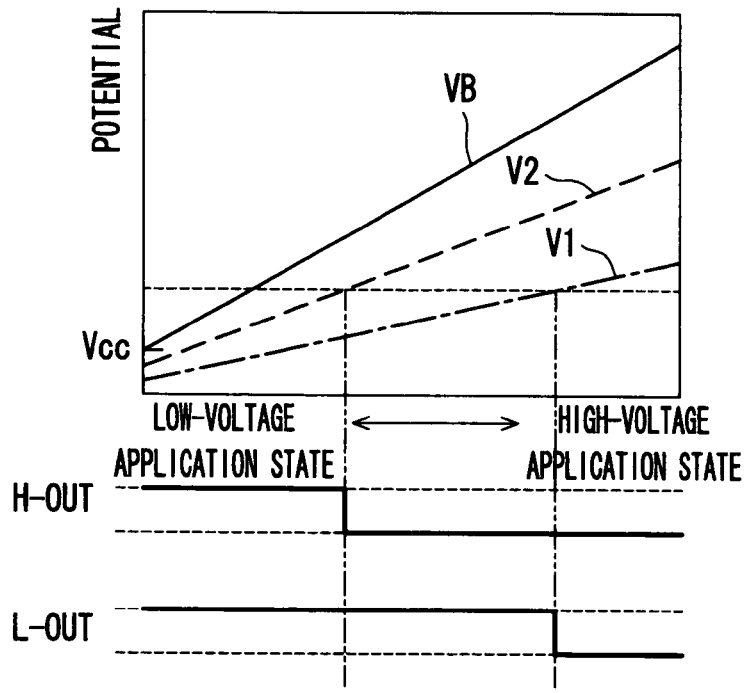
FIG. 34 is a view showing the relationship between the potential change and the operation of the CMOS circuit on the low-potential side of the semiconductor device according to Embodiment 11.
Figure 35:
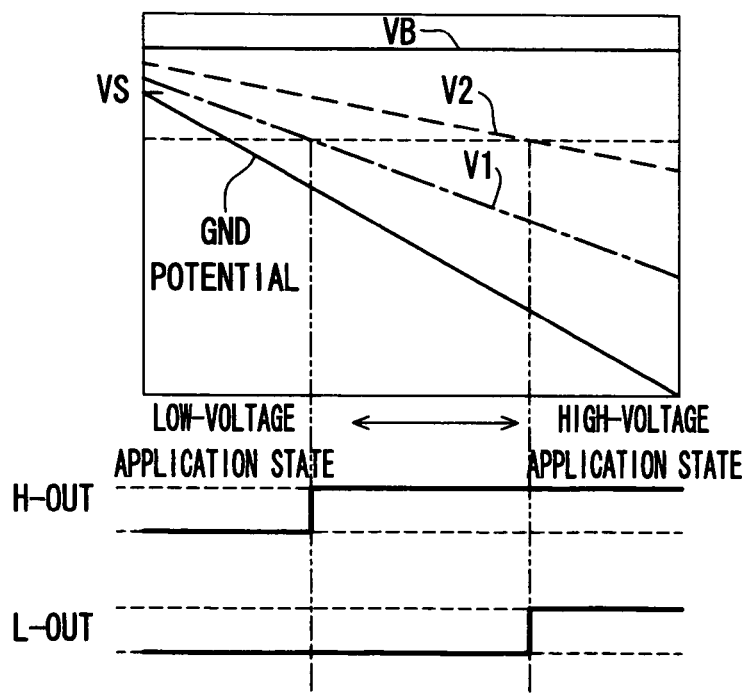
FIG. 35 is a view showing the relationship between the potential change and the operation of the CMOS circuit on the high-potential side of the semiconductor device according to Embodiment 11.

A semiconductor device according to Embodiment 11 of the present invention will be described below referring to the accompanying drawings. FIG. 31 is a view showing a configuration of a power integrated circuit device (HVIC) serving as the semiconductor device according to Embodiment 11 in which a method for detecting the potential of the multi-trench separation region is applied. As in the HVIC according to the aforementioned Embodiment 9, in the HVIC according to Embodiment 11, a contact is formed on each trench of the multi-trench separation region 405 and connected to the gate electrodes (polysilicon portions) of the CMOS circuits formed inside the high-potential island and the low-voltage region. FIG. 32 shows an equivalent circuit in an example of the HVIC shown in FIG. 31. FIG. 33A is a sectional view of the HVIC, taken on line A-A' of FIG. 31, and shows the regions of a P-channel MOS device. FIG. 33B is a sectional view of the HVIC, taken on line B-B' of FIG. 31, and shows the regions of an N-channel MOS device. When it is assumed that the capacitance of one trench separation region is C, the potentials V1 and V2 of the trenches are represented by V1=VB/3 and V2=2VB/3, respectively, owing to capacitance coupling. The potential VB of the high-potential island is changed from Vcc to (Vcc+H.V.) by the inverter operation of a power device, such as an IGBT, that is driven by the HVIC. Herein, (H.V.) designates a high voltage applied to the high-voltage power device. The relationship between the potential change and the CMOS circuit operation in the HVIC according to Embodiment 11 is shown in FIGS. 34 and 35. FIG. 34 is a view illustrating the operation on the low-potential side of the CMOS circuit, in which the left side of the figure shows a low-voltage application state and the right side of the figure shows a high-voltage application state. FIG. 35 is a view illustrating the operation on the high-potential side of the CMOS circuit, in which the left side of the figure shows a low-voltage application state and the right side of the figure shows a high-voltage application state. The broken level lines in the upper graphs in FIG. 34 and FIG. 35 show the levels of the threshold voltage setting values of CMOS inverters, respectively.

Because the potential GND is used as the reference in the low-voltage region, when the potential VB rises from the lowest potential Vcc, V1 and V2 also rise accordingly. At this time, with respect to the threshold voltage setting values of the CMOS inverters, the CMOS inverter (on the side of the N-channel MOS device) connected to V2 is first set from OFF to ON (in the case of the P-channel MOS device, the state is opposite), whereby the output H-OUT changes from High to Low. At this time, the potential of the CMOS inverter connected to V1 has not yet reached the threshold voltage as shown in FIG. 34. Hence, the output L-OUT is held High. When the voltage VB rises further and when the potential V1 rises to the threshold voltage or higher, the output L-OUT changes from High to Low. The potential of the high-potential island can be detected in the low-voltage region by detecting the change of this signal.

Because the potential VB is used as the reference in the high-potential island, when the potential VB rises from the lowest potential Vcc, V1 and V2 drop apparently as shown in FIG. 35. At this time, with respect to the threshold voltage setting values of the CMOS inverters, the CMOS inverter (on the side of the P-channel MOSFET device) connected to V1 is first set from OFF to ON (in the case of the N-channel MOS device, the state is opposite), whereby the output H-OUT changes from Low to High. Similarly, when the voltage VB rises further and when the potential V2 rises to the threshold voltage or higher, the output L-OUT changes from Low to High. The potential of the high-potential island itself can be detected by detecting the change of this signal.

Embodiment 12

Figure 36:
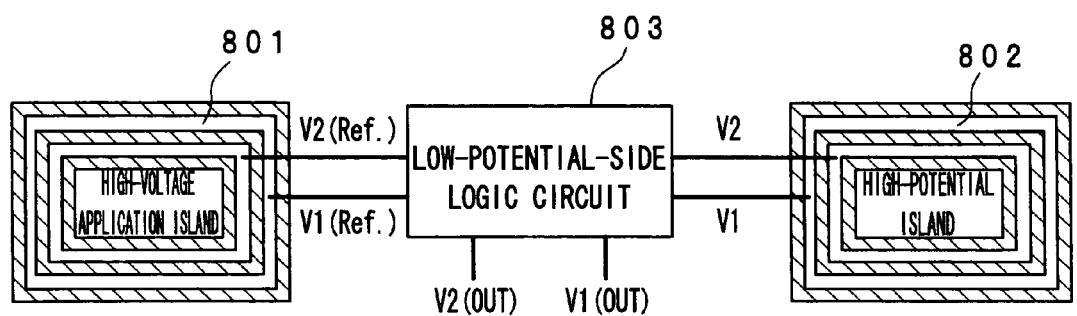
FIG. 36 is a configurational view showing an example of a semiconductor device according to Embodiment 12 in which a method for detecting the potential of the multi-trench separation region is applied.
Figure 37:
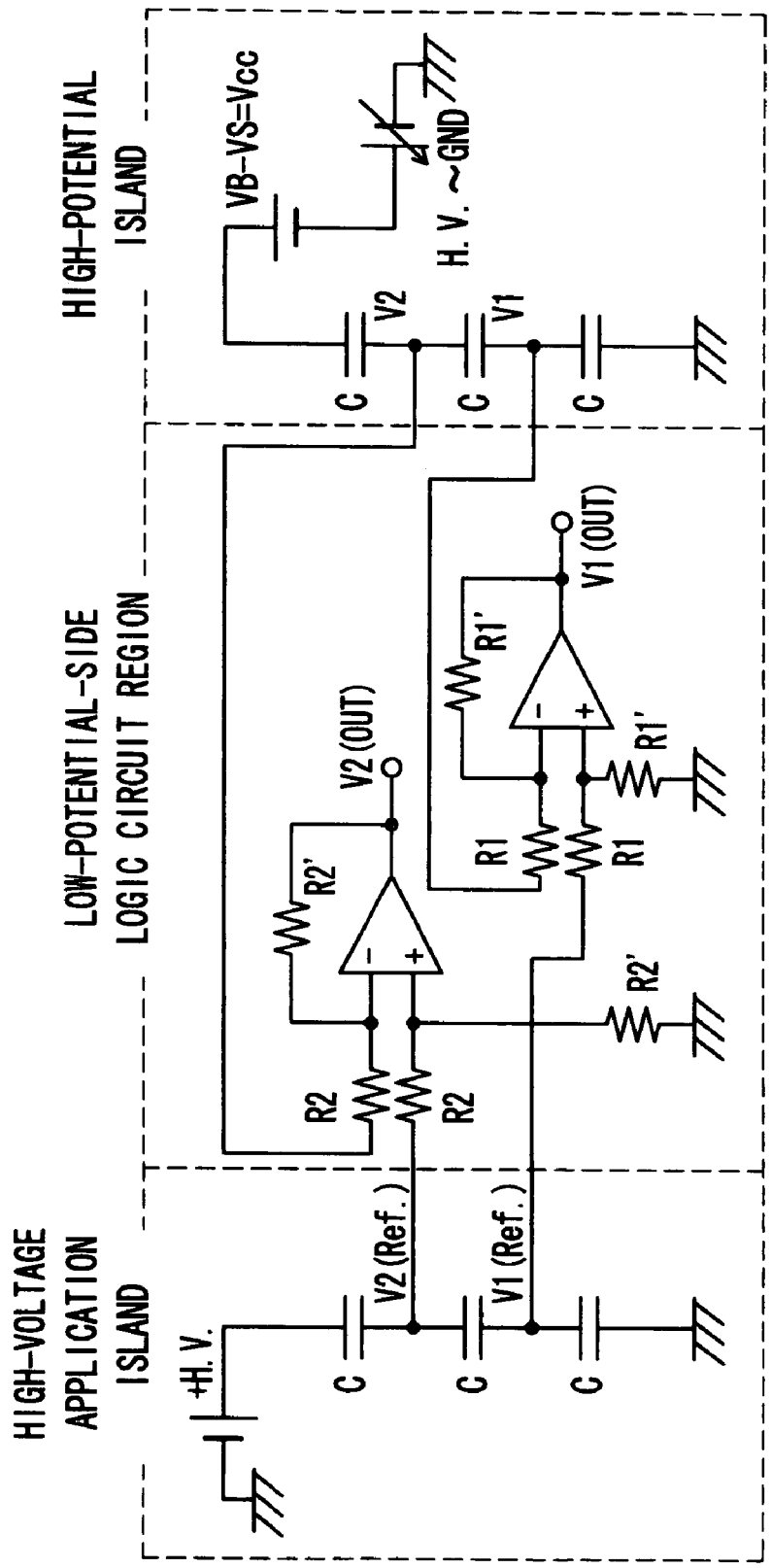
FIG. 37 shows an equivalent circuit of the semiconductor device according to Embodiment 12.

A semiconductor device according to Embodiment 12 of the present invention will be described below referring to the accompanying drawings. FIG. 36 is a configurational view showing an example of a power integrated circuit device (HVIC) serving as the semiconductor device according to Embodiment 12 in which a method for detecting the potential of the multi-trench separation region is applied. FIG. 37 is an equivalent circuit of the HVIC according to Embodiment 12. The HVIC according to Embodiment 12 is provided with a high-voltage application island 801 to which the potential of a bus is directly applied. When it is assumed that the capacitance of one trench separation region in the multi-trench separation region in which this high-voltage application island 801 is formed is Cref, and when a high voltage (H. V.) is applied to the potential of the bus, potentials, V1(Ref)=(H.V.)/3 and V2(Ref)=2(H.V.)/3, are generated by capacitance coupling. On the other hand, in the high-potential island 802, as described above in Embodiment 11, V1=VB/3 and V2=2VB/3 are obtained, and the potential VB changes from nearly the potential GND to (H. V.). Because the potential of the bus is constant (H. V.), the voltages V1(Ref) and V2(Ref) become the reference voltages for V1 and V2, respectively. As shown in the equivalent circuit of FIG. 37, when V1 (Ref) and V1 are input to a voltage comparison circuit (an operational amplifier in the example shown in the figure) and when V2(Ref) and V2 are input to another voltage comparison circuit, their outputs are:

$$V1(OUT)=(R1'/R1)(V1(\text{Ref})-V1) \text{ and}$$

$$V2(OUT)=(R2'/R2)(V2(\text{Ref})-V2).$$

Because the potential difference can be amplified/attenuated depending on the ratio in resistance, the output can be adjusted to Low when the potential VB of the high-potential island 802 becomes to (H. V.), and the output can be adjusted to High when the potential VB lowers to the potential GND. Hence, the potential of the high-potential island 802 can be monitored using a low-voltage-side logic circuit 803.

Embodiment 13

Figure 38:
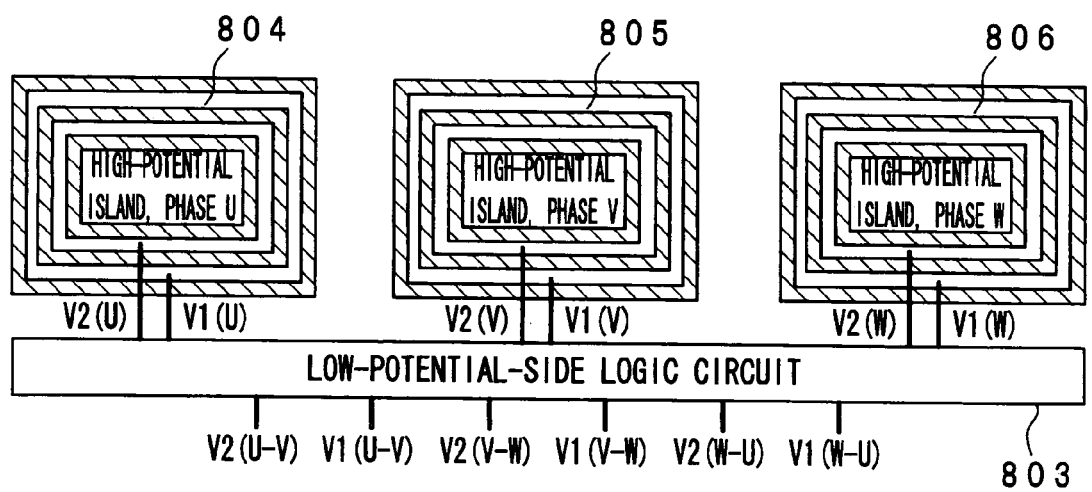
FIG. 38 is a view showing the configuration of a semiconductor device according to Embodiment 13.

A semiconductor device according to Embodiment 13 of the present invention will be described below referring to the accompanying drawings. FIG. 38 is a view showing the configuration of a power integrated circuit device (HVIC) serving as the semiconductor device according to Embodiment 13.

In the aforementioned Embodiment 12, the multi-trench separation region potential of the high-potential island 802 to which the bus potential (H. V.) is applied is compared with the multi-trench separation region potential of the high-voltage application island 801 on which the low-potential logic circuit 803 for carrying out gate. drive operation is mounted. In Embodiment 13, in the case that high-potential islands having two or more phases (phases U, V and W) 804, 805 and 806 are mounted on a single chip, the potential relationship among the high-potential islands 804, 805 and 806 can be sensed by detecting the potentials of the respective trench separation regions. In other words, it is possible to monitor which of the high-potential islands 804, 805 and 806 has a high potential.

The configuration according to Embodiment 13 is obtained by replacing the potential island to which (H. V.) is applied with another high-potential island on which a logic circuit for carrying out gate drive operation is mounted, in the equivalent circuit of Embodiment 12 shown in FIG. 37. Basically, the potential relationship among the phases is controlled using the low-potential-side logic circuit that issues a gate drive instruction. Hence, in Embodiment 13, an error operation can be detected by comparing the gate drive instruction with an actual potential relationship monitor signal, and a protection operation can be carried out Embodiment 14

A power integrated circuit device (HVIC) serving as a semiconductor device according to Embodiment 14 is configured that the detection of the potential of the multi-trench separation region in the HVIC described above in Embodiments 11 to 13 is carried out by monitoring the potential divided by the high resistance in the HVIC according to the aforementioned Embodiment 9. With this configuration, the HVIC according to Embodiment 14 can monitor the detection of the potential of the multi-trench separation region.

Embodiment 15

Figure 39:
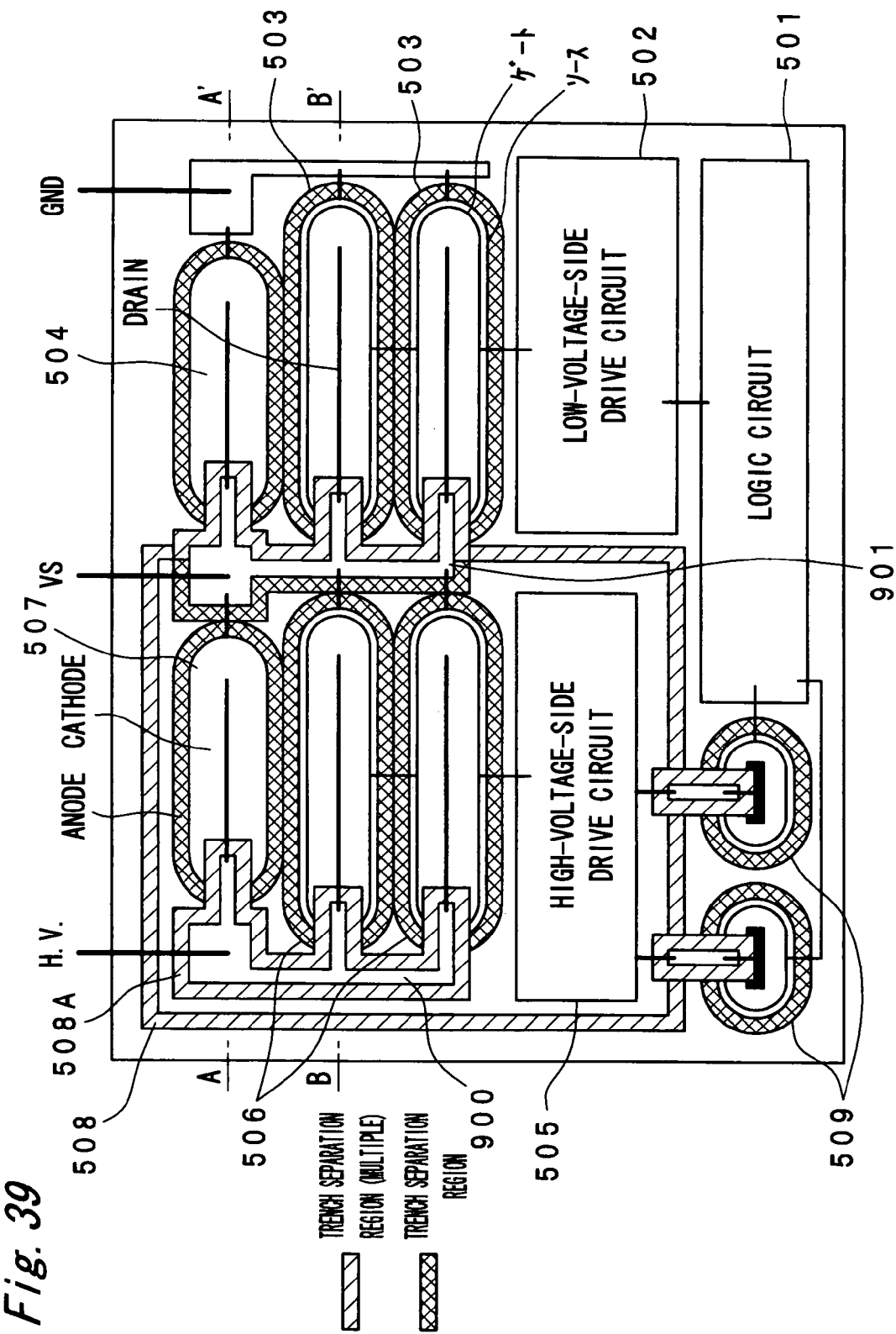
FIG. 39 is a view showing a configurational example of a semiconductor device according to Embodiment 15 in which the high-potential wires of the multi-trench separation region are applied.
Figure 40:
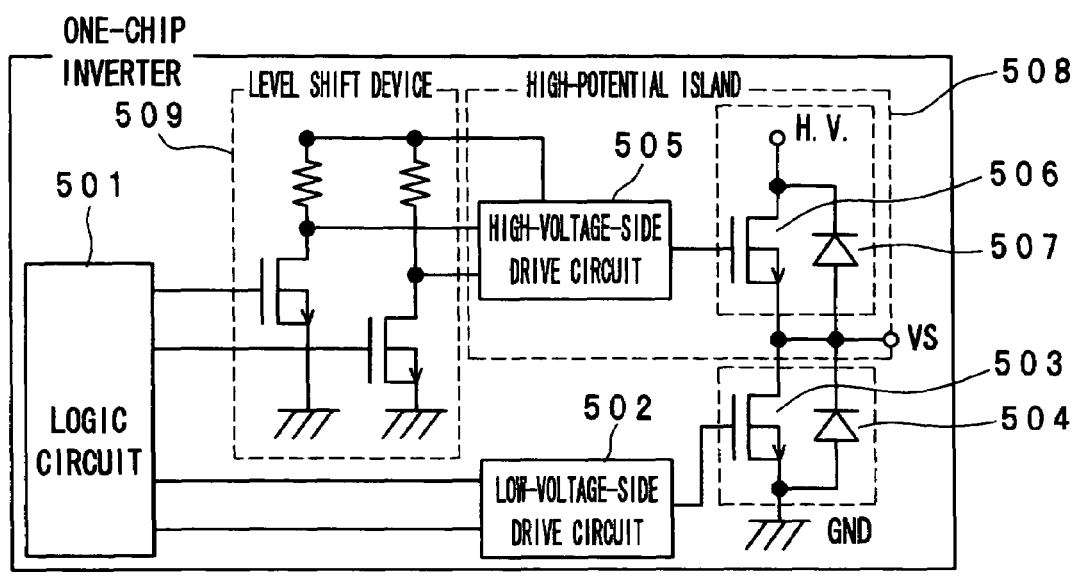
FIG. 40 shows an equivalent circuit of the semiconductor device according to Embodiment 15.

A semiconductor device according to Embodiment 15 of the present invention will be described below referring to the accompanying drawings. A one-chip inverter serving as the semiconductor device according to Embodiment 15 and shown in FIG. 39 is a configurational example in which the high-potential wires (level shift wires) of the multi-trench separation region are applied. FIG. 40 is an equivalent circuit of the one-chip inverter according to Embodiment 15, and FIGS. 41A and 41B, are sectional views of the main portions thereof. FIG. 41A is a sectional view taken on line A-A' of FIG. 39, and FIG. 41B is a sectional view taken on line B-B' of FIG. 39.

The one-chip inverter according to Embodiment 15 comprises a logic circuit 501 that controls the operations of interfaces to external devices and all the operations of the chip using low potentials, a low-voltage-side drive circuit 502 that drives a low-voltage-side power device 503 (N-channel MOSFET or IGBT) according to control signals from the logic circuit 501, the power device (N-channel MOSFET or IGBT) 503 that has a high-withstand voltage and is driven using the low-voltage-side drive circuit 502, a high-withstand voltage diode 504 that is connected in parallel with the power device 503 and carries out reflux operation, a level shift device (N-channel MOSFET) 509 that has a high-withstand voltage and transmits control signals from the low-voltage-side logic circuit 501 to the control circuit inside the high-potential island, a high-voltage-side drive circuit 505 that receives the drain current of the level shift device 509 and drives a high-voltage-side power device 506 (N-channel MOSFET or IGBT) according to control signals from the logic circuit 501, the power device 506 (N-channel MOSFET or IGBT) that has a high-withstand voltage and is driven by the high-voltage-side drive circuit 505, a high-withstand voltage diode 507 that is connected in parallel with the power device 506 and carries out reflux operation, and a multi-trench separation region 508 that is formed so as to enclose the high-voltage-side power device 506 and is capable of high voltage separation.

The drain of the high-voltage-side power device 506 is connected to the high voltage (H. V.), and its source is connected to the drain of the low-voltage-side power device 503, and the source of the low-voltage-side power device 503 is connected to the potential GND. The potential of the connection portion of the high-voltage-side power device 506 and the low-voltage-side power device 503 is the reference potential Vs in the high-voltage-side drive circuit 505. When the high-voltage-side power device 506 is ON and the low-voltage-side power device 503 is OFF, Vs=(H. V.). When the high-voltage-side power device 506 is OFF and the low-voltage-side power device 503 is ON, Vs=GND. Hence, the high-voltage lead wire, which is formed inside the high-potential island and to which (H. V.) is applied, is formed of the multi-trench separation region 508 that is capable of high voltage separation for the voltage of the above-mentioned high-potential island. As shown in FIGS. 41A and 41B, in a high-voltage lead wire 900 (H. V. potential), separation between Vs and (H. V.) is carried out using a multi-trench separation region 508A, and separation between GND and Vs is carried out using another multi-trench separation region 508 that is disposed outside the region so as to enclose the high-voltage-side power device 506.

The high-voltage lead wire 900, which is configured as described above and to which (H. V.) is applied, forms a trench side wall field plate for the high-voltage power device 506 and the high-withstand voltage diode 507. Furthermore, a high-voltage lead wire 901, to which Vs is applied, forms a trench side wall field plate using the multi-trench separation region 508 that forms the high-potential island, as in the case of the level shift device 509.

In the configuration of the semiconductor device according to Embodiment 15, there is no region in which low-voltage portions intersect with high-potential wires. Hence, the high-withstand voltage structure is not affected, and the device has stable characteristics. In addition, in the circuit configuration of the semiconductor device according to Embodiment 15, an electrode can be formed using one aluminum wire. Hence, the production of the device is made easy, and the cost of the production can be reduced significantly.

Embodiment 16

Figure 42:
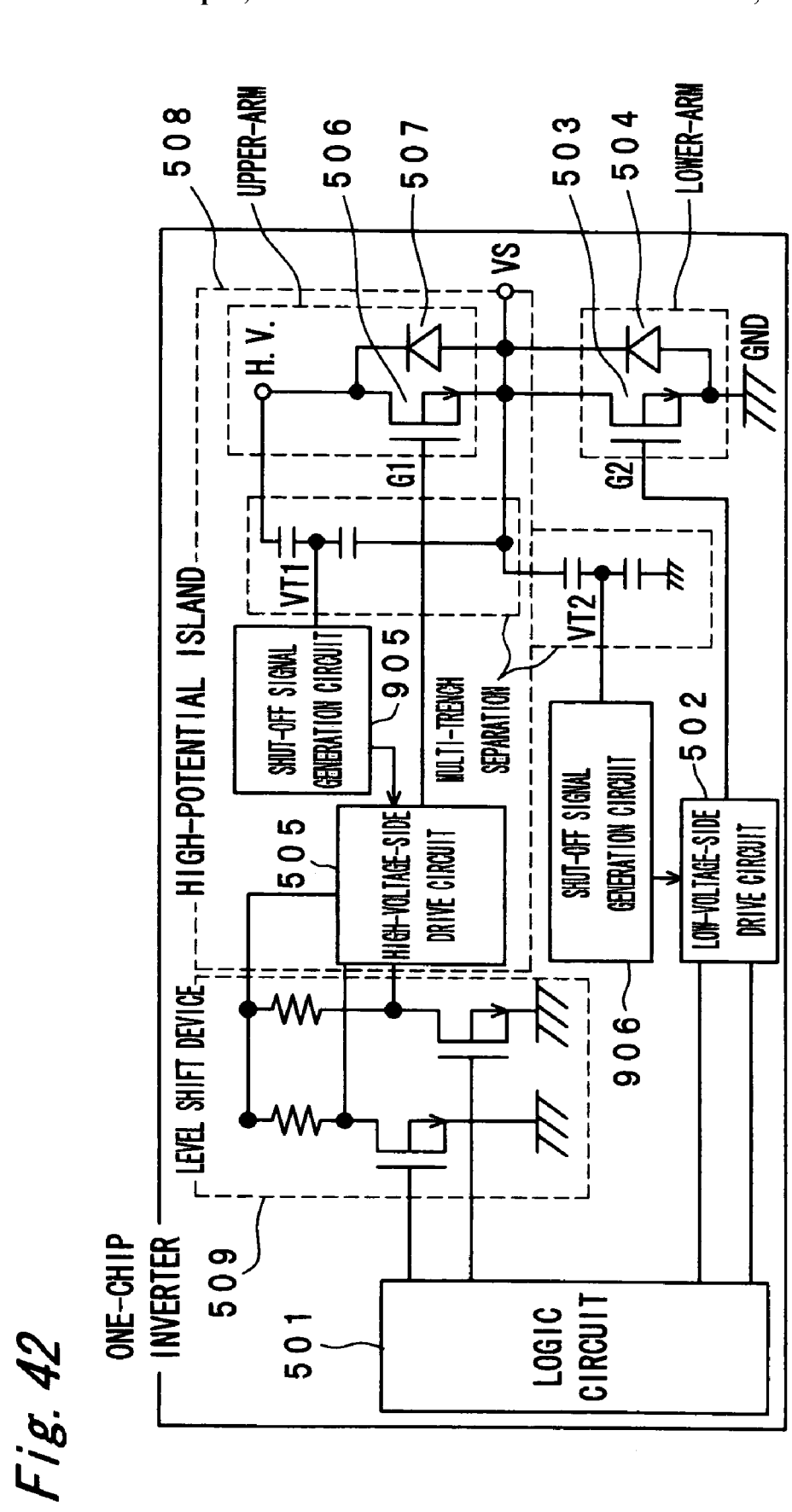
FIG. 42 shows an equivalent circuit of the configuration of a semiconductor device according to Embodiment 16.

A semiconductor device according to Embodiment 16 of the present invention will be described below referring to the accompanying drawings. FIG. 42 shows an equivalent circuit of the configuration of the one-chip inverter IC serving as the semiconductor device according to Embodiment 16.

Figure 43:
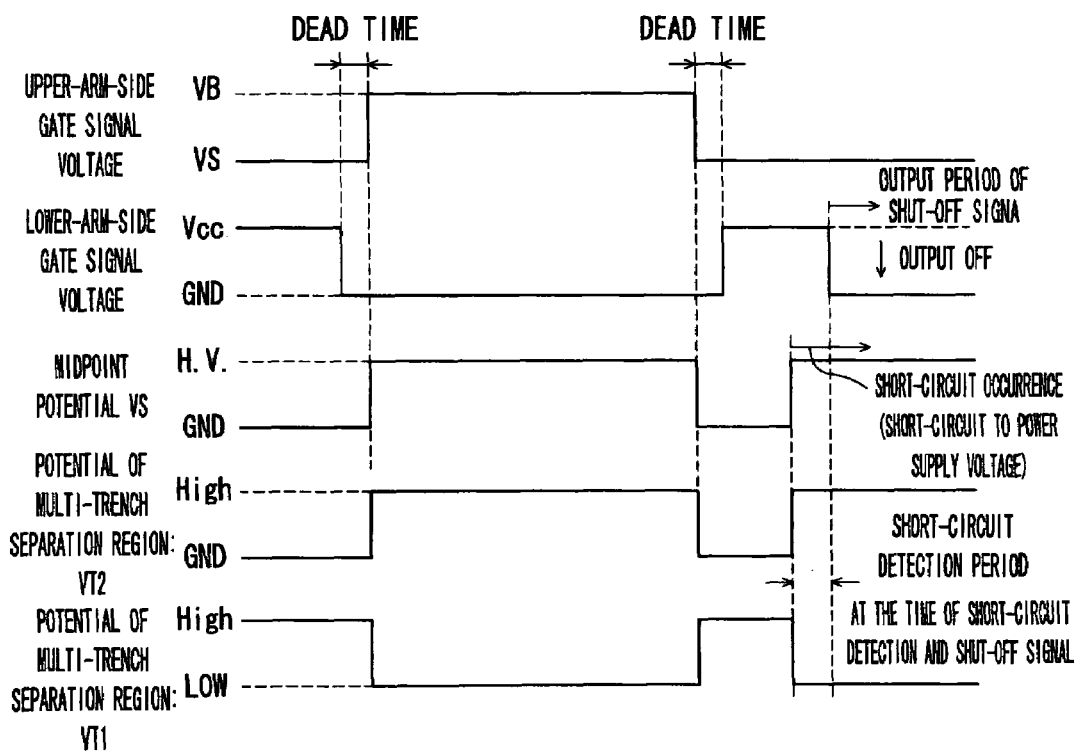
FIG. 43 is a waveform diagram showing the operation of the semiconductor device according to Embodiment 16.
Figure 44:
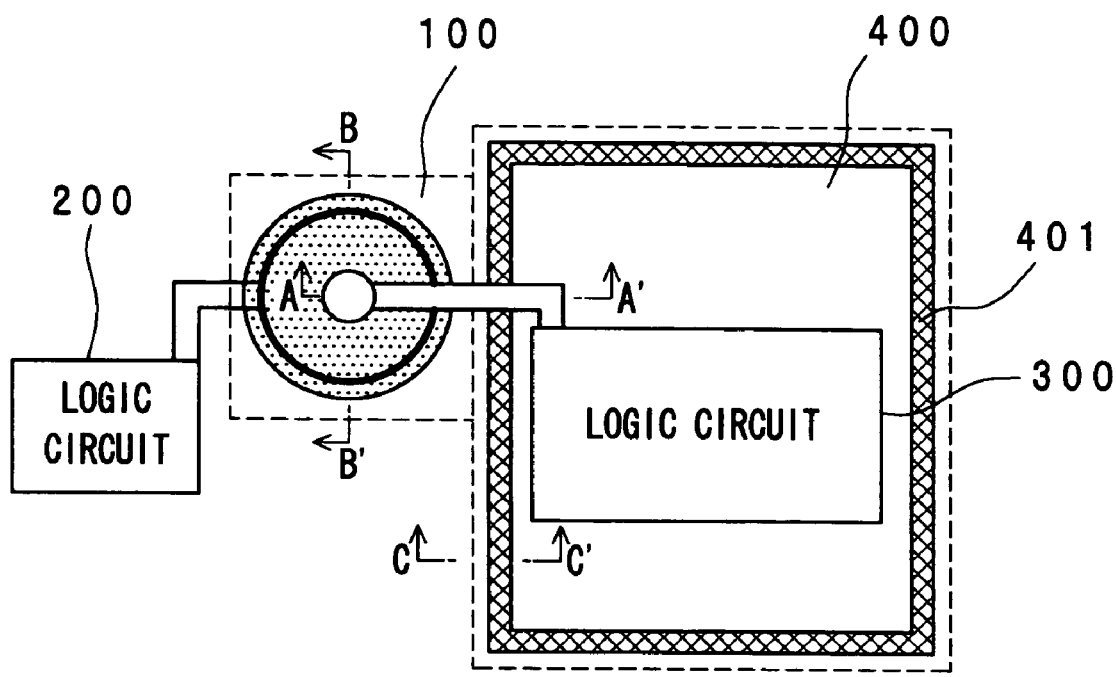
FIG. 44 is the plan view showing the conventional power integrated circuit device.

The multi-trench separation region that forms the high-voltage lead wire to which the high voltage (H. V.) is applied generates an intermediate potential VT1, that is, a potential difference between (H. V.) and VB, owing to capacitance coupling with respect to the voltage of the high-potential island on which the region is formed, as described above in the configuration of the Embodiment 11. The potential applied to the high-voltage-side power device can be monitored by detecting the potential. The monitoring method is the same as that in the configuration according to Embodiment 11 described above. The high-potential island to which Vs is applied is capacitance coupled similarly, and an intermediate potential VT2 between potentials VB and GND is generated. These operations are shown in FIG. 43. The high-potential-side (upper-arm-side) N-channel MOSFET is OFF when its gate signal is VS, and the N-channel MOSFET is ON when its gate signal is VB. Furthermore, the low-potential-side (lower-arm-side) N-channel MOSFET is OFF when its gate signal is GND, and the N-channel MOSFET is ON when its gate signal is Vcc. A dead time is provided when the high-potential-side N-channel MOSFET and the low-potential-side N-channel MOSFET are switched so that both the MOSFETs are not turned ON simultaneously and so that the upper and lower arms are not short-circuited. In other words, a period is provided during which both the MOSFETs are OFF at the time of switching. When the high-potential-side N-channel MOSFET is OFF and the low-potential-side N-channel MOSFET is ON, the intermediate potential (Vs) to which both the devices are connected is the potential GND. At this time, the intermediate potential VT1 between potentials (H.V.) and VB is High (VT1−VB=(H.V.)/2 in the example of FIG. 42), and the intermediate potential VT2 between potentials VB and GND is the potential GND. In the case that a load connected to the terminal Vs during this period is broken and the bus is short-circuited, Vs becomes equal to (H.V.), whereby an excessive current flows through the low-potential-side N-channel MOSFET that is in the ON state. If this state continues, the low-potential-side N-channel MOSFET is broken. At this time, the potential VT2 is changed from GND to High (VT2=(H.V.)/2 in the example of FIG. 42), and the potential VT1 is changed from High to Low (VT1−VB is nearly 0 in the example of FIG. 42). This potential change is detected using high-voltage shut-off signal generation circuits 905 and 906, and shut-off instructions for turning OFF the respective power devices are generated to the corresponding drive circuits. Because the semiconductor device according to Embodiment 16 is configured as described above, reliable short-circuit protection operation can be carried out, and the reliability of the device can be raised.

What is claimed is:

1. A semiconductor device in which a high withstand voltage semiconductor device and logic circuits are integrated on a single chip, comprising:
    said high-withstand voltage semiconductor device having an oxide film and an epitaxial layer on a support substrate,
    a high-potential-side logic circuit connected to the high-potential-side electrode of said high-withstand voltage semiconductor device,
    a low-potential-side logic circuit that outputs control signals for controlling the driving of said high-withstand voltage semiconductor device, and
    a multi-trench separation region that separates a high-potential island including said high-potential-side logic circuit, that is formed of multiply overlaid trench separation regions biased by using capacitance couplings and that has a level shift region for connecting said high-potential-side logic circuit to the high-potential-side electrode of said high-withstand voltage semiconductor device and wherein
    a part of said multiply overlaid trench separation regions is arranged to overlap with a part of said high-withstand voltage semiconductor device, and
    said level shift region is biased by the capacitance coupling to have high-potential in said multiply overlaid trench separation regions, and is arranged in an area overlapping with the part of said high-potential-side logic circuit, so as to connect said high-potential-side logic circuit to the high-potential-side electrode of said high-withstand voltage semiconductor device.

2. A semiconductor device according to claim 1, wherein said level shift region in said multi-trench separation region is provided between the source and the drain of said high-withstand voltage semiconductor device, the outermost trench separation region in said multi-trench separation region is disposed so as to make contact with the low-potential-side electrode of said high-withstand voltage semiconductor device, and the trench separation region in said multi-trench separation region, having the highest potential and making contact with said high-potential island, is disposed so as to make contact with said high-potential-side electrode of said high-withstand voltage semiconductor device.

3. A semiconductor device according to claim 2, wherein the space between the opposed trench separation regions separated by the level shift region in said multi-trench separation region is electrically connected using said level shift region.

4. A semiconductor device according to claim 1, wherein a metal wire is provided in the level shift region, and said metal wire is used to electrically connect said high-potential-side logic circuit to the high-potential-side electrode of said high-withstand voltage semiconductor device.

5. A semiconductor device according to claim 1, wherein a multiple field plate is formed between the source and the drain of said high-withstand voltage semiconductor device, and said multiple field plate is connected to the trench side wall field plate in said level shift region.

6. A semiconductor device according to claim 1, wherein the high-potential electrode of said high-withstand voltage semiconductor device substantially has a circular shape, and is electrically connected to said high-potential-side logic circuit using said level shift region.

7. A semiconductor device according to claim 1, wherein a $P^+$-type diffusion region or an $N^+$-type diffusion region is formed in the epitaxial layer of said multi-trench separation region.

8. A semiconductor device according to claim 1, wherein level shift wires are provided in said level shift region, and said high-potential-side logic circuit is electrically connected to the respective high-potential-side electrodes of said high-withstand voltage semiconductor device using said level shift wires.

9. A semiconductor device according to claim 1, wherein said trench separation regions in said multi-trench separation region are formed of multiple partition walls, and insulating films are formed on said partition walls.

10. A semiconductor device according to claim 1, wherein a high resistor is provided between GND and said high-potential island, and each trench separation region in said multi-trench separation region is connected to a predetermined point on said high resistor, respectively, so that each trench separation region shares a predetermined potential, respectively.

11. A semiconductor device according to claim 1, wherein a CMOS circuit is provided for each trench separation region in said multi-trench separation region to detect a potential of the trench separation region.

12. A semiconductor device according to claim 1, wherein a high-voltage application island, which is separated using said multi-trench separation region and to which a constant high potential of a bus is applied, is provided, and a low-potential-side logic circuit is provided, adapted to compare the potential of each trench separation region in said multi-trench separation region in which said high-voltage application island is formed with the potential of each trench separation region in said multi-trench separation region in which said high-potential island is formed to detect the potential of said high-potential island.

13. A semiconductor device according to claim 1, wherein a low potential side logic circuit is provided, adapted to compare the potential of said respective trench separation regions in said multi-trench separation regions in which multiple high-potential islands are formed are compared mutually to detect the potentials of said respective high-potential islands.

14. A semiconductor device according to claim 1, wherein a CMOS circuit is provided for each trench separation region in said multi-trench separation region is detected using a CMOS circuit, a high resistor is provided between GND and said high-potential island, and each trench separation region in said multi-trench separation region is connected to a predetermined point on said high resistor so that each trench separation region share a predetermined potential.

15. A method for producing a semiconductor device in which a high-withstand voltage semiconductor device and logic circuits are integrated on a single chip, said semiconductor device comprising:
   the high-withstand voltage semiconductor device having an oxide film and an epitaxial layer on a support substrate
   a high-potential-side logic circuit connected to the high-potential-side electrode of said high-withstand voltage semiconductor device,
   a low-potential-side logic circuit that outputs control signals for controlling the driving of said high-withstand voltage semiconductor device, and
   a multi-trench separation region that separates a high-potential island including said high-potential-side logic circuit, that is formed of multiply overlaid trench separation regions biased by using capacitance couplings and that has a level shift wire region for connecting said high-potential-side logic circuit to the high-potential-side electrode of said high-withstand voltage semiconductor device, and wherein
   a part of said multiply overlaid trench separation regions is arranged to overlap with a part of said high-withstand voltage semiconductor device, and
   said level shift region is biased by the capacitance coupling to have high-potential in said multiply overlaid trench separation regions, and is arranged in a region, which overlaps with the part of said high-potential-side logic circuit, so as to connect said high-potential-side logic circuit to the high-potential-side electrode of said high-withstand voltage semiconductor device,
   wherein said method includes forming said level shift wire region by carrying out:
      a step of forming trenches in said epitaxial layer by carrying out anisotropic etching,
      a step of oxidizing the interiors of said trenches and burying polysilicon in said trenches,
      a step of etching said polysilicon while leaving said polysilicon inside said trenches, oxidizing the surface, accumulating a nitride film, and carrying out patterning,
      a step of eliminating said nitride film by carrying out selective oxidation and accumulating an interlayer oxide film, and
      a step of partially etching said interlayer oxide film and forming electrodes by carrying out metal accumulation.

16. A method for producing a semiconductor device according to claim 15, wherein said level shift region in said multi-trench separation region is formed between the source and the drain of said high-withstand voltage semiconductor device, the outermost trench separation region in said multi-trench separation region is disposed so as to make contact with the low-potential-side electrode of said high-withstand voltage semiconductor device, and the trench separation region in said multi-trench separation region, having the highest potential and making contact with said high-potential island, is disposed so as to make contact with said high-potential-side electrode of said high-withstand voltage semiconductor device.

17. A method for producing a semiconductor device according to claim 15, wherein an insulating film is formed inside each of said trenches by carrying out CVD oxidation in the step of burying polysilicon in said trenches.

* * * * *

UNITED STATES PATENT AND TRADEMARK OFFICE
CERTIFICATE OF CORRECTION

PATENT NO. : 7,582,946 B2  Page 1 of 1
APPLICATION NO. : 11/393773
DATED : September 1, 2009
INVENTOR(S) : Shimizu It is certified that error appears in the above-identified patent and that said Letters Patent is hereby corrected as shown below:

On the title page, Item (73), the Assignee's information is incorrect. Item (73) should read:

-- (73) Assignee:  Mitsubishi Denki Kabushiki Kaisha,
 Tokyo (JP) --

Signed and Sealed this

Third Day of November, 2009

David J. Kappos
*Director of the United States Patent and Trademark Office*